(12) United States Patent
Urata

(10) Patent No.: US 12,166,462 B2
(45) Date of Patent: Dec. 10, 2024

(54) FILTER DEVICE AND COMMUNICATION APPARATUS

(71) Applicant: KYOCERA Corporation, Kyoto (JP)

(72) Inventor: Tomonori Urata, Kyoto (JP)

(73) Assignee: KYOCERA Corporation, Kyoto (JP)

( * ) Notice: Subject to any disclaimer, the term of this patent is extended or adjusted under 35 U.S.C. 154(b) by 347 days.

(21) Appl. No.: 17/639,195

(22) PCT Filed: Aug. 18, 2020

(86) PCT No.: PCT/JP2020/031093
§ 371 (c)(1),
(2) Date: Feb. 28, 2022

(87) PCT Pub. No.: WO2021/039495
PCT Pub. Date: Mar. 4, 2021

(65) Prior Publication Data
US 2022/0329226 A1 Oct. 13, 2022

(30) Foreign Application Priority Data
Aug. 30, 2019 (JP) .................................. 2019-157981

(51) Int. Cl.
*H03H 7/38* (2006.01)
*H03H 7/01* (2006.01)
*H03H 7/09* (2006.01)
*H03H 9/64* (2006.01)
*H03H 9/00* (2006.01)

(52) U.S. Cl.
CPC ............... *H03H 7/38* (2013.01); *H03H 7/01* (2013.01); *H03H 7/09* (2013.01); *H03H 9/6483* (2013.01); *H03H 9/0009* (2013.01)

(58) Field of Classification Search
CPC .............................. H03H 7/09; H03H 7/0115
USPC ................................................... 333/175, 185
See application file for complete search history.

(56) References Cited

U.S. PATENT DOCUMENTS

| | | | |
|---|---|---|---|
| 2009/0058555 A1* | 3/2009 | Takata | ................. H03H 9/0576 333/129 |
| 2015/0042417 A1 | 2/2015 | Onodera et al. | |
| 2016/0322956 A1 | 11/2016 | Takeuchi et al. | |
| 2018/0109243 A1 | 4/2018 | Takamine | |
| 2018/0241418 A1 | 8/2018 | Takamine et al. | |
| 2018/0375495 A1 | 12/2018 | Taguchi | |

(Continued)

FOREIGN PATENT DOCUMENTS

| | | |
|---|---|---|
| JP | 2015-033080 A | 2/2015 |
| JP | 2018-137655 A | 8/2018 |
| JP | 2019-009769 A | 1/2019 |

(Continued)

*Primary Examiner* — Rakesh B Patel
(74) *Attorney, Agent, or Firm* — Volpe Koenig

(57) ABSTRACT

A filter device includes a port, a reference potential part, at least one filter, a signal line, a first inductor, and at least one second inductor. A signal is input through the port, and/or a signal is output through the port. The reference potential part is placed at a reference potential. The at least one filter filters a signal. The signal line connects the port to the at least one filter. The first inductor is at least part of the signal line. The second inductor forms a connection between the signal line and the reference potential part. The first inductor and the at least one second inductor are inductively coupled to each other.

20 Claims, 15 Drawing Sheets

(56) References Cited

U.S. PATENT DOCUMENTS

2020/0014365 A1\* 1/2020 Nambu .................. H03H 9/725

FOREIGN PATENT DOCUMENTS

| WO | 2015/104882 A1 | 7/2015 |
| WO | 2016/208670 A1 | 12/2016 |

\* cited by examiner

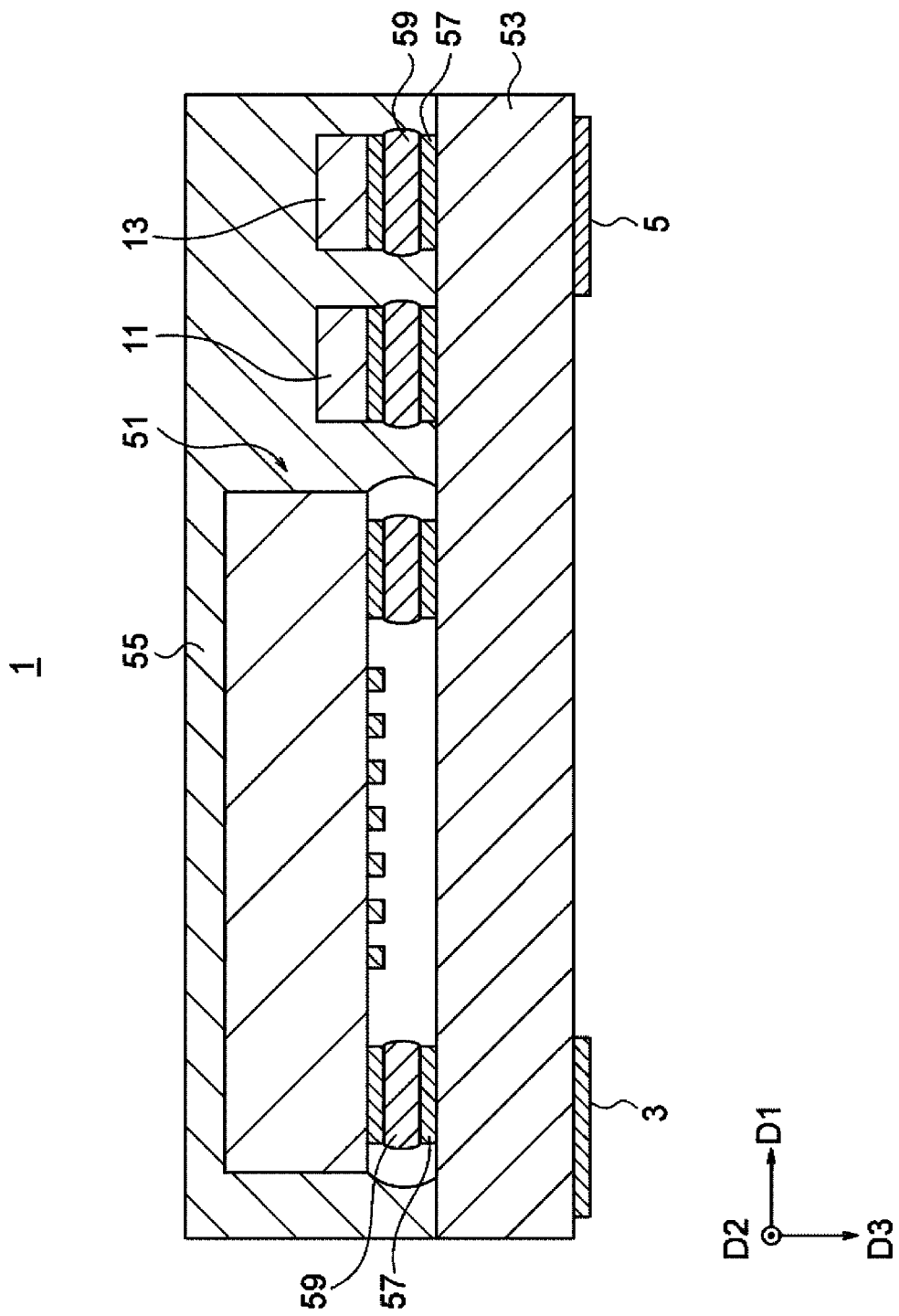

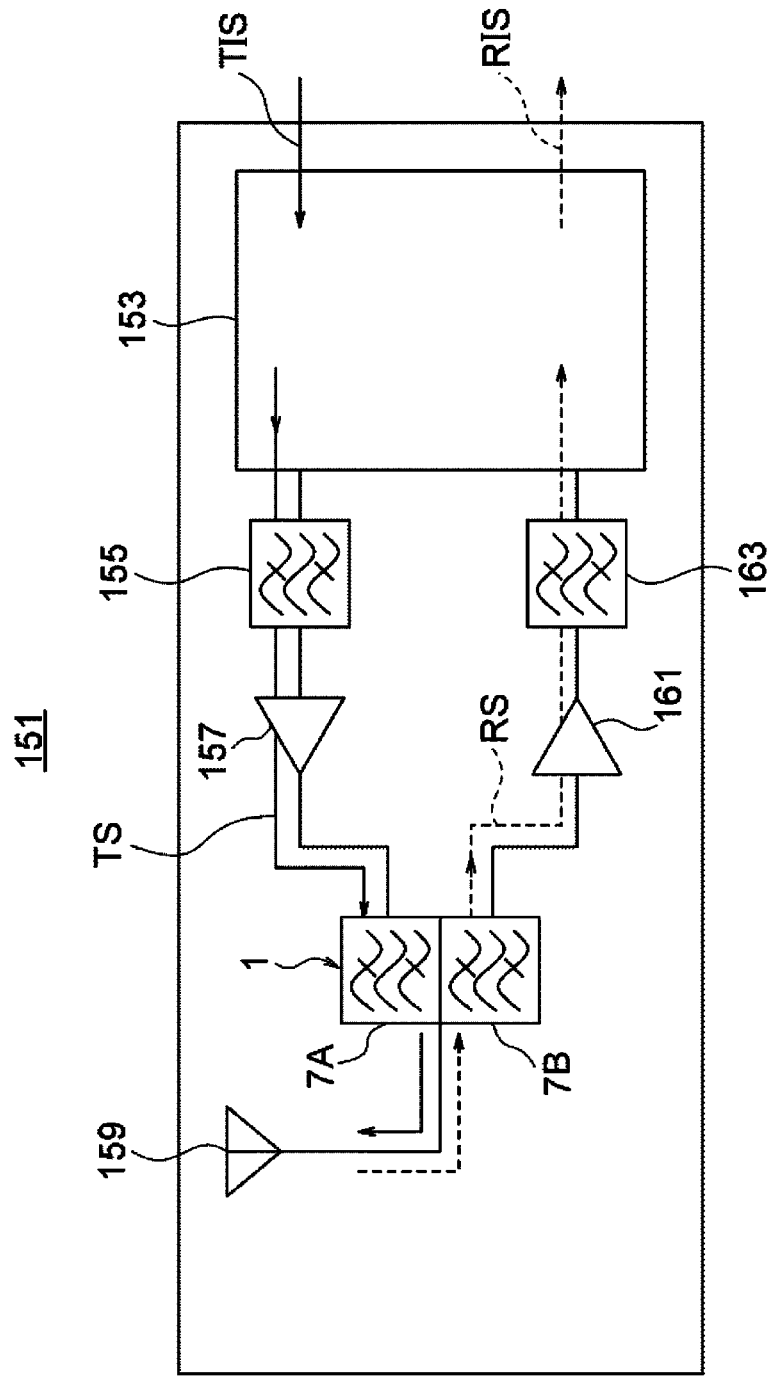

FILTER DEVICE AND COMMUNICATION APPARATUS

TECHNICAL FIELD

The present disclosure relates to a filter device configured to filter signals and to a communication apparatus including the filter device.

BACKGROUND ART

Known filter devices each include: one or more filters that filter signals; one or more ports (terminals) through which signals are input to the filters; and one or more ports (terminals) through which signals are output from the filters (see, for example, PTL 1 and PTL 2).

A device disclosed in PTL 1 includes a port (terminal), a multiplexer, and two inductors (a first inductor and a second inductor) that are closer than the multiplexer (i.e., filters included in the multiplexer) to the port (see FIG. 11D in PTL 1). The first inductor is connected in series with and between the port and the filters. One end of the second inductor is connected between the first inductor and the filters, and the other end of the second inductor is connected to a reference potential part.

A device disclosed in PTL 2 is designed such that a matching element (an inductor or a capacitor) closer than filters to a port is inductively coupled to an inductor connected parallel to a filter other than a filter that is closest to the matching element. According to PTL 2, the inductive coupling provides a sub-transmission path for transmission of signals. PTL 2 indicates that the sub-transmission path supplementary to a main transmission path extending across a filter part including the filters is conductive to improving the attenuation characteristics.

CITATION LIST

Patent Literature

PTL 1: Japanese Unexamined Patent Application Publication No. 2018-137655
PTL 2: International Publication No. 2015/104882

SUMMARY OF INVENTION

A filter device according to an aspect of the present disclosure includes a port, a reference potential part, at least one filter, a signal line, a first inductor, and at least one second inductor. A signal is input through the port, and/or a signal is output through the port. The reference potential part is placed at a reference potential. The at least one filter filters a signal. The signal line connects the port to the at least one filter. The first inductor is at least part of the signal line. The least one second inductor forms a connection between the signal line and the reference potential part. The first inductor and the at least one second inductor are inductively coupled to each other.

A communication apparatus according to another aspect of the present disclosure includes the filter device, an antenna, and an integrated circuit element. The antenna is connected to the port. The integrated circuit element is connected in such a manner that the integrated circuit element and the port are located on opposite sides with the at least one filter therebetween.

BRIEF DESCRIPTION OF DRAWINGS

FIG. 14 is a sectional view of the filter device illustrated in FIG. 1, schematically illustrating a third example structure of the filter device.

FIG. 15 is a block diagram illustrating a principal part of an example communication apparatus into which the filter device illustrated in FIG. 1 is adopted.

DESCRIPTION OF EMBODIMENTS

Overview of Basic Configuration of Filter Device

Figure 1:
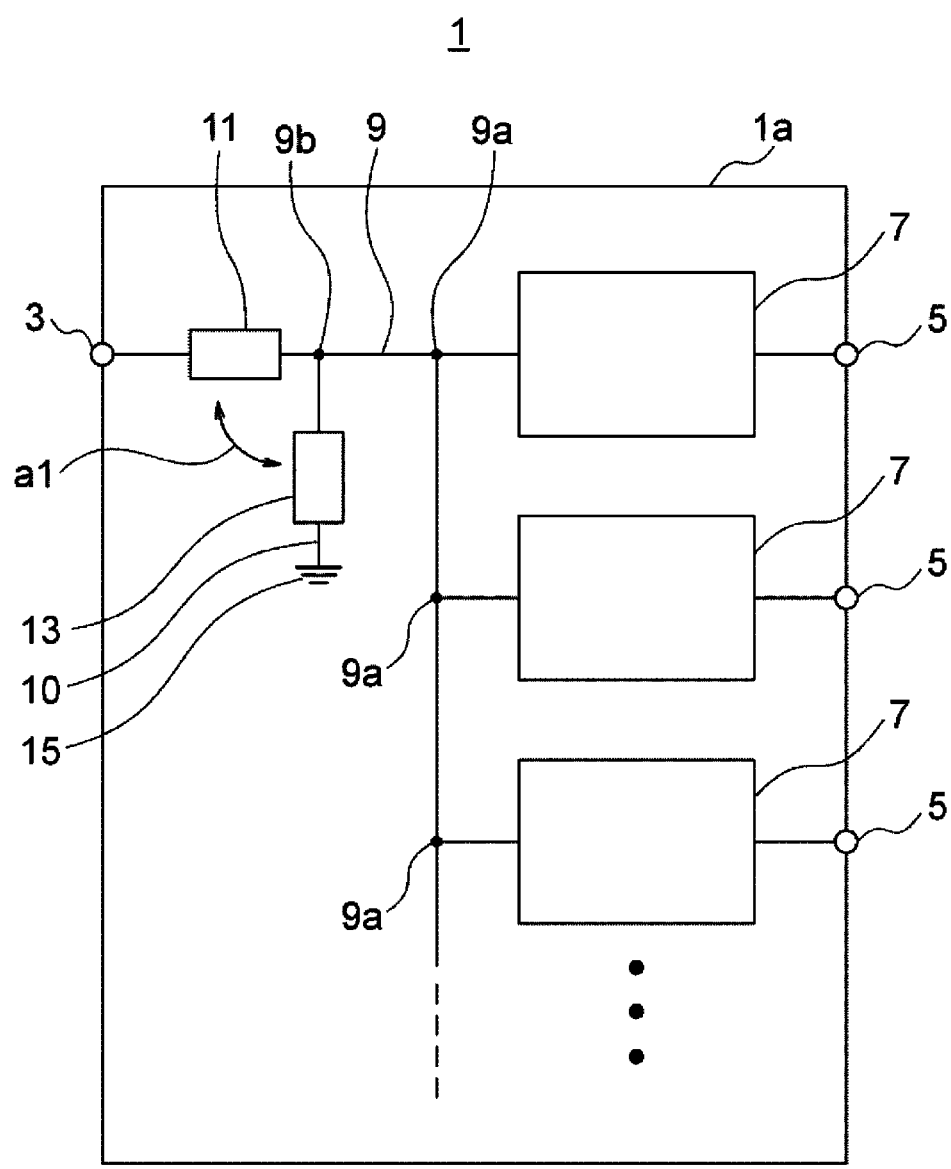
FIG. 1 is a block diagram schematically illustrating the configuration of a filter device according to an embodiment.

FIG. 1 is a block diagram schematically illustrating the configuration of a filter device 1 according to an embodiment.

The filter device 1 is, for example, an electronic component. The electronic component may be in the form of a chip. For example, the filter device 1 has an outer surface 1a and includes terminals, each of which is denoted by 3 or 5 and is exposed at the outer surface 1a. The outer surface 1a may have any desired shape. For example, the outer surface 1a may be substantially in the shape of a rectangular parallelepiped.

The filter device 1 in the example illustrated in the drawings is configured as a multiplexer for transmission and/or reception of signals in different frequency bands. The filter device 1 includes a common terminal 3 and signal terminals 5. The common terminal 3 is electrically connected with a first element (e.g., an antenna) that can be used to transmit and/or receive signals in different frequency bands. Each of the signal terminals 5 is electrically connected to the corresponding one of second elements (e.g., radio-frequency circuits) that are provided for signals in the respective frequency bands. The filter device 1 allows the shared use of the first element by the second elements and reduces the interaction between the second elements (e.g., unintended superposition of signals processed by the second elements).

More specifically, the filter device 1 may be configured as follows to serve as a duplexer. The common terminal 3 is connected with an antenna that can be used to transmit transmission signals and to receive reception signals. Some of the signal terminals 5 are electrically connected with transmitting circuits configured to generate transmission signals and to input the transmission signals to the duplexer. The other signal terminals 5 are electrically connected with receiving circuits configured to receive reception signals from the duplexer. The duplexer reduces the possibility that unintended superposition of transmission signals in different frequency bands will occur in the transmitting circuits, and the duplexer also reduces the possibility that unintended superposition of reception signals in different frequency bands will occur in the receiving circuits.

Such a duplexer configured to process two signals in the respective frequency bands is a concrete example of the multiplexer; however, the multiplexer may process any number of signals. For example, the multiplexer may be a triplexer configured to process three signals in the respective frequency bands or may be a quadplexer configured to process four signals (two transmission signals and two reception signals) in the respective frequency bands.

The filter device 1 may be designed for any desired type of signals; that is, it is not required that the filter device 1 be designed for both a transmission signal and a reception signal. The filter device 1 may allow only a transmission signal to pass therethrough or may allow only a reception signal to pass therethrough. Each frequency band supported by the filter device 1 may include two or more frequency ranges that are treated as different frequency bands by a device configured to input a signal to the filter device 1 and/or to output a signal to the filter device 1.

In certain technical fields, the term "multiplexer" is used in a narrow sense. In some cases, the term "multiplexer" refers exclusively to a device configured to combine two or more signals and to output the resultant signal. As will be understood from the description given above, the term "multiplexer" referred to in the present disclosure is to be understood in a broad sense.

To function as a multiplexer, the filter device 1 includes filters 7, which are disposed between the common terminal 3 and the signal terminals 5.

Each of the filters 7 is connected in series with and between the common terminal 3 and the corresponding one of the signal terminals 5. Each filter 7 filters a signal input through the common terminal 3 and outputs the resultant signal through the corresponding signal terminal 5 or filters a signal input through the corresponding signal terminal 5 and outputs the resultant signal through the common terminal 3. That is, each filter 7 allows only a signal in the corresponding frequency band to pass therethrough.

The filters 7 in the example illustrated in the drawing are in a one-to-one correspondence with the signal terminals 5. Alternatively, each filter 7 may correspond to two signal terminals 5. In the former case, signals input or output through the signal terminals 5 are unbalanced signals each having a signal level corresponding to the potential difference with respect to the reference potential. In the latter case, signals input or output through the signal terminals 5 are balanced signals each being composed of two signals opposite in phase and having a signal level corresponding to the potential difference between the two signals. For convenience, an embodiment will be described below in which the filters 7 are essentially in a one-to-one correspondence with the signal terminals 5.

The filters 7 are connected in parallel and connected to the common terminal 3. More specifically, the filters 7 are connected to the common terminal 3 in a manner so as to branch off downstream of the common terminal 3. The filters 7 have different passbands; that is, each of the filters 7 allows a signal in the corresponding frequency band to pass therethrough. This configuration enables transmission and/or reception of signals in different frequency bands through the same common terminal 3 and reduces the possibility that unintended superposition of signals will occur at the signal terminals 5.

The number of filters 7 included in the filter device 1 may be changed as appropriate in accordance with the number of signals for which the filter device 1 is designed (in accordance with the number of frequency bands supported by the filter device 1). For example, a duplexer may include two filters 7. A triplexer may include three filters 7. A quadplexer may include four filters 7.

The filter device 1 includes a signal line 9, which connects the common terminal 3 to one or more filters 7. The signal line 9 includes a first inductor 11, which will be described later. One end of the signal line 9 is connected to the common terminal 3. On the opposite side, the signal line 9 are divided into branches for connection to the filters 7, with branch points being denoted by 9a. Any desired number of branch points 9a may be provided, and each branch point 9a may be placed in any desired location. The signal line in the example illustrated in the drawing is divided into two lines branching off at the first branch point 9a. One of the lines is connected to one of the filters 7. The other line is divided into two lines branching off at the next branch point 9a. This pattern is repeated, and two lines branching off at the last branch point 9a are connected to the respective filters 7. In some embodiments, three of more lines may branch off at each branch point 9a and may be connected to the respective filters 7. In a case where the filter device 1 is a duplexer, one branch point 9a is provided.

The signal line 9 (the first inductor 11) is not connected parallel to one or more filters structurally identical to the filters 7. For example, the signal line 9 is not connected parallel to series resonators included in an acoustic wave filter that will be described later. The filter device 1 does not include a path connecting the common terminal 3 to the filters 7 and connected parallel to the signal line 9. In some embodiments, the filter device 1 may include such a path; however, none of the filters is entirely or partially located on the path. More specifically, the filter device 1 may include a filter that is entirely or partially located on the path; however, none of the filters structurally identical to the filters 7 is entirely or partially located on the path.

The signal line 9 does not include one or more filters structurally identical to the filters 7. For example, the signal line 9 does not include series resonators included in an acoustic wave filter that will be described later. It is not required that one or more filters structurally different from the filters 7 be entirely or partially included in the signal line 9. For example, the signal line 9 exclusive of the first inductor 11 (or the signal line 9 including the first inductor 11 as will be described later) may simply be an interconnection. Any desired electronic element (e.g., a resistor, a capacitor, or an inductor other than the first inductor 11) may be connected to the signal line 9 to exert influence on the filter characteristics of the filter device 1.

Inductor

The filter device 1 includes the first inductor 11 and a second inductor 13, which are closer than the filters 7 to the common terminal 3. As denoted by an arrow a1, inductive coupling is formed between the first inductor 11 and the second inductor 13. The impedance of the filter device 1 may be adjusted accordingly. This will be described below in more detail.

The first inductor 11 is included in the signal line 9. The first inductor 11 is connected between and in series with the common terminal 3 and the filters 7. More specifically, the first inductor 11 is closer than all of the filters 7 to the common terminal 3. When viewed from another perspective, the first inductor 11 is closer than all of the branch points 9a to the common terminal 3. The first inductor 11 is connected in series with the filters 7. In some embodiments, the first inductor 11 may be opposite to the common terminal 3 with any one of the branch point 9a therebetween and may be connected in series with only a specified one of the filters 7.

The second inductor 13 forms a connection between the signal line 9 and a reference potential part 15. The second inductor 13 is connected to the signal line 9 at a connection point 9b, which is located between the first inductor 11 and the filters 7 as illustrated in FIG. 1. Alternatively, the connection point 9b may be located between the common terminal 3 and the first inductor 11 (see FIG. 8A).

The first inductor 11 and the second inductor 13 each may be an inductor of a desired inductance. Actions and effects arising from the inductive coupling, which will be described later, may be taken into consideration for the inductance of each of these inductors. In some embodiments, the inductance may be set irrespective of the actions and effects arising from the inductive coupling. For example, the inductance of each of these inductors may be set so as to provide the impedance matching at the common terminal 3 of the filter device 1 without consideration given to the inductive coupling, which will be described later. The first inductor 11 and the second inductor 13 may function as all or part of filters of one type. The first inductor 11 and the second inductor 13 each may simply be an interconnection. This means that the inductance of each of the first inductor 11 and the second inductor 13 may be equal in magnitude to the inductance inherent in the interconnection.

The reference potential part 15 may be any desired part of the filter device 1. The reference potential part 15 may be a reference potential terminal placed at a reference potential. As with the signal terminals 5, the reference potential terminal may be exposed at the outer surface of the filter device 1. The radio-frequency circuits (transmitting circuits and/or receiving circuits) connected to the signal terminals 5 may apply the reference potential to a reference potential terminal.

Another electronic element (not illustrated) may be disposed between the common terminal 3 and the filters 7 and may be connected in series with the first inductor 11 or connected parallel to the first inductor 11. Still another electronic element may be disposed between the connection point 9b and the reference potential part 15 and may be connected in series with the second inductor 13 or connected parallel to the second inductor 13. Examples of the electronic element concerned include a resistor, an inductor other than the first and second inductors, and a capacitor.

Although interconnections each forming a connection between different elements are conceptually illustrated in FIG. 1, these interconnections may be eliminated. For example, the terminal 3 may be provided to an end portion of the first inductor 11. Similarly, each terminal 5 may be provided to an end portion of the corresponding filter 7. The connection point 9b may be adjacent to an end portion of the first inductor 11 and/or an end portion of the second inductor 13.

First Example Configuration of Inductors

Figure 2A:
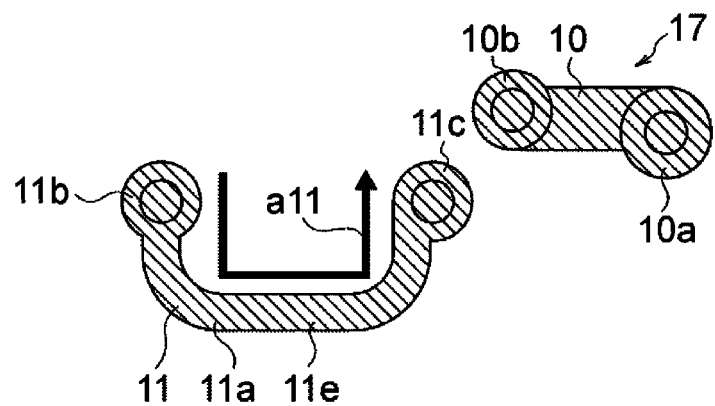
FIGS. 2A, 2B, and 2C are plan views and illustrate a first example configuration of a first inductor and a second inductor included in the filter device illustrated in FIG. 1.
Figure 2B:
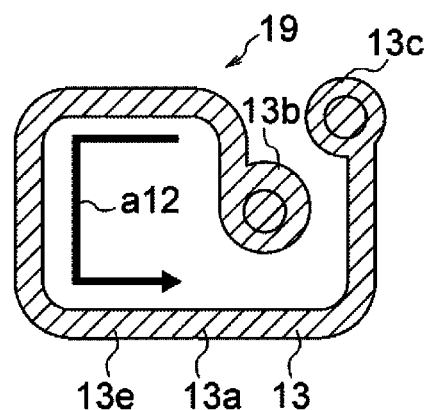
Figure 2C:
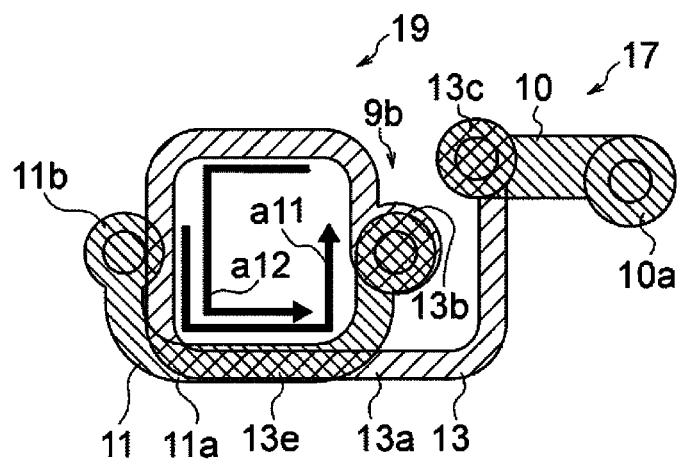

FIGS. 2A to 2C are plan views and illustrate a first example configuration of the first inductor 11 and the second inductor 13.

The first inductor 11 and the second inductor 13 each may be a conductor layer. FIG. 2A is a plan view of a first conductor layer 17, which includes the first inductor 11. FIG. 2B is a plan view of a second conductor layer 19, which includes the second inductor 13. The first conductor layer 17 and the second conductor layer 19 are arranged in a stack. FIG. 2C is a see-through plan view of the first conductor layer 17 and the second conductor layer 19. The first conductor layer 17 and the second conductor layer 19 each may be made of any desired material and each may have any desired thickness.

The first conductor layer 17 in this example includes the first inductor 11 and a reference potential line 10. As illustrated in FIG. 1, the reference potential line 10 is an interconnection that forms a connection between the second inductor 13 and the reference potential part 15. An end portion 10a of the reference potential line 10, that is, an end portion at the right on the drawing plane is connected to the reference potential part 15.

The first inductor 11 includes a first line 11a. An end portion 11b of the first line 11a is connected to the common terminal 3. An end portion 11c of the first line 11a is connected to the filters 7. Referring to FIGS. 2A and 2C, an arrow a11 denotes the direction in which the first line 11a extends from the common terminal 3 toward the filters 7. The connection between the end portion 11b and the common terminal 3 and the connection between the end portion 11c and the filters 7 each may be formed by any desired conductor, such as a conductor orthogonal to the first conductor layer 17. Circles (bearing no reference sign) in the drawing each denote such a conductor.

The second inductor 13 includes a second line 13a. An end portion 13b of the second line 13a is connected to the signal line 9. An end portion 13c of the second line 13a is connected to the reference potential part 15. Referring to FIGS. 2B and 2C, an arrow a12 denotes the direction in which the second line 13a extends from the signal line 9 to the reference potential part 15. The end portion 13b is connected to the end portion 11c of the first inductor 11 with a conductor therebetween such that the end portion 13b is connected to the signal line 9. The conductor is orthogonal to the second conductor layer 19 and is denoted by a circle (bearing no reference sign). The end portion 11c is the connection point 9b. The end portion 13c is connected to an end portion 10b of the reference potential line 10 with a conductor therebetween such that the end portion 13c is connected to the reference potential part 15. The conductor is orthogonal to the second conductor layer 19 and is denoted by a circle (bearing no reference sign).

The first line 11a and the second line 13a are strip-shaped. The dimension (length) of each line in the direction of transmission of a signal is greater than each of the dimensions (the width and the thickness) of the line that are orthogonal to the direction of transmission of a signal. For example, the length of each line is greater than or equal to five times the width thereof and is greater than or equal to five times the thickness thereof. The first line 11a and the second line 13a each may be a line of constant width (and of constant thickness) or may be a line of inconsistent width. The first line 11a and the second line 13a may have specific desired dimensions. The material, the width, and/or the thickness of the first line 11a may be similar to or different from those of the second line 13a. The first line 11a and the second line 13a in the example illustrated in the drawings are roughly equal in width. For example, the difference between the widths of these lines is less than or equal to 10% of the width of one of these lines that is wider than the other.

As illustrated in the drawings, the first line 11a and the second line 13a each include a winding section. In the example illustrated in the drawings, the entirety of the first line 11a and the entirety of the second line 13a wind. Nevertheless, the first line 11a and the second line 13a do not necessarily include winding sections. For example, the first line 11a and the second line 13a each may extend in a straight line. The number of winding turns formed by the winding section of the first line 11a may be less than one as in the example illustrated in the drawings or may be more than or equal to one. The number of winding turns formed by the second line 13a may be more than one as in the example illustrated in the drawing or may be less than or equal to one. In a case where the number of winding turns is less than one, the winding section may wind at any desired angle. The number of winding turns may be more than or equal to one; that is, the winding section may form any number of winding turns. Such a winding turn may form a shape of any desired diameter. The diameter of the shape defined by the winding section of the first line 11a may be equal to or different from the diameter of the shape defined by the winding section of the second line 13a.

The judgement as to whether the lines wind may be made in an appropriate manner. For example, the number of winding turns formed by the second line 13a may be one or may be more than one as in the example illustrated in the drawings. In this case, it is obvious that the line winds. In a case where the number of winding turns is less than one, whether the line winds may be judged on the basis of the longitudinal direction of the line, that is, the direction from one end to the other end of the line. If the direction changes by a predetermined degree or more (e.g., by an angle of 90° or more or by an angle of 180° or more), it may be judged that the line winds. For example, the first line 11a in the example illustrated in the drawing is laterally bent into a 90° angle at two different points toward the same side; that is, the longitudinal direction of the first line 11a changes by an angle of 180° in total. It may thus be judged that the first line 11a winds. It may also be judged that the line concerned winds if the line is bent into a 90° degree at only one point. In some embodiments, the line may be entirely curved; that is, the longitudinal direction of the line may change gradually. If the longitudinal direction of the line (i.e., the direction from one end to the other end of the line) changes by the predetermined degree of more, it may be judged that the line winds.

Inductive Coupling in First Example Configuration

As mentioned above, the first inductor 11 and the second inductor 13 are inductively coupled to each other. The first line 11a includes a first coupling portion 11e, and the second line 13a includes a second coupling portion 13e. The first coupling portion 11e and the second coupling portion 13e extend in parallel. The first coupling portion 11e and the second coupling portion 13e extending in parallel provide inductive coupling.

More specifically, there is an overlap between the first coupling portion 11e and the second coupling portion 13e in this example as illustrated in the see-through plan view of the conductor layers including these coupling portions. The inductive coupling may arise mainly from the overlap. The overlap may extend substantially over the entire width of the first coupling portion 11e and/or the entire width of the second coupling portion 13e or may extend over part of the width of the first coupling portion 11e and/or part of the width of the second coupling portion 13e. The overlap between the first coupling portion 11e and the second coupling portion 13e in the example illustrated in the drawings extends substantially over the entire widths of these sections (e.g., over 80% or more of each coupling portion).

The first coupling portion 11e and the second coupling portion 13e may extend in parallel over a desired distance and/or may overlap each other over a desired distance. In a case where the first line 11a and the second line 13a includes their respective winding sections or either of these lines includes a winding section, the distance over which these lines extend in parallel and/or the distance over which these lines overlap each other may correspond to part of the winding section(s) (as in the example illustrated in the drawing) or may correspond to the entirety of the winding section(s).

The portions extending in parallel and/or the overlap between the first line 11a and the second line 13a each may be in the form of a straight line or may wind. The first line 11a and the second line 13a in the example illustrated in the drawing wind along with each other. In other words, the end portion 11b of the first line 11a, the second bent portion of the first line 11a, and the portion extending therebetween extend parallel to the second line 13a. That is, the first line 11a and the second line 13a extending in parallel each may be bent into a 90° angle at one point as in the example illustrated in the drawing or each may be bent into a 90° angle at more than one point. In this example, a portion being part of the overlap between the first line 11a and the second line 13a and extending substantially over the entire widths of these lines is roughly in the form of a straight line.

As denoted by the arrows a11 and a12, the direction along the first coupling portion 11e from the common terminal 3 (the end portion 11b) toward the filters 7 (the end portion 11c) coincides with the direction along the second coupling portion 13e from the signal line 9 (the end portion 13b) toward the reference potential part 15 (the end portion 13c). The inductive coupling based on this relationship may be herein referred to as forward inductive coupling.

As stated above, the direction along the first coupling portion 11e coincides with the direction along the second coupling portion 13e; nevertheless, it is not required that the first coupling portion 11e and the second coupling portion 13e extend in parallel. For example, the coupling portions may be inclined in a manner so as to form an angle of less than 45°, an angle of less than 30°, or an angle of less than 15°. An angle of less than 15°, an angle of less than 10°, or an angle of less than 5° may be formed by the coupling portions, in which case the coupling portions may be deemed to extend substantially in parallel. The same holds for a second example configuration in which the directions concerned are opposite to each other. The second example will be described later. The directions concerned may be determined with respect to the center lines of the inductor lines.

The distance between the first coupling portion 11e and the second coupling portion 13e (and/or the distance between the first conductor layer 17 and the second conductor layer 19) and/or the distance over which the first coupling portion 11e and the second coupling portion 13e extend in parallel may be set to a specific desired value in light of actions and effects that will be described later. It is required that the distance between the first coupling portion 11e and the second coupling portion 13e (and/or the distance between the first conductor layer 17 and the second conductor layer 19) be less than or equal to the distance where inductive coupling can be provided. The distance for providing inductive coupling may be determined as appropriate in accordance with the signal intensity and the characteristics (e.g., the dielectric constant) of the material disposed between the inductors. The distance between the first coupling portion 11e and the second coupling portion 13e (and/or the distance between the first conductor layer 17 and the second conductor layer 19) may be less than or equal to 200 μm, less than or equal to 100 μm, less than or equal to 50 μm, or less than or equal to 30 μm.

Second Example Configuration of Inductors

Figure 3A:
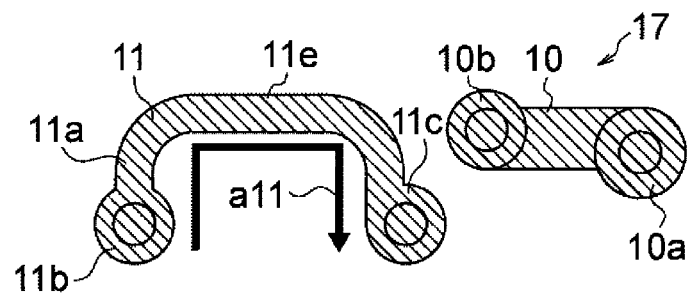
FIGS. 3A, 3B, and 3C are plan views and illustrate a second example configuration of the first inductor and the second inductor included in the filter device illustrated in FIG. 1.
Figure 3B:
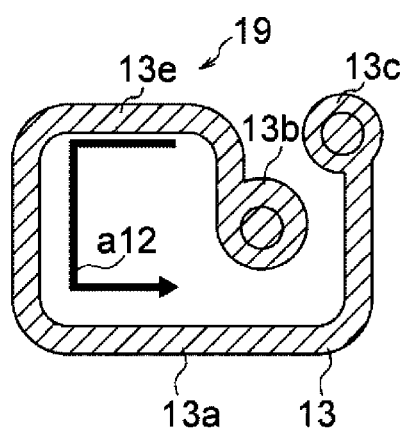
Figure 3C:
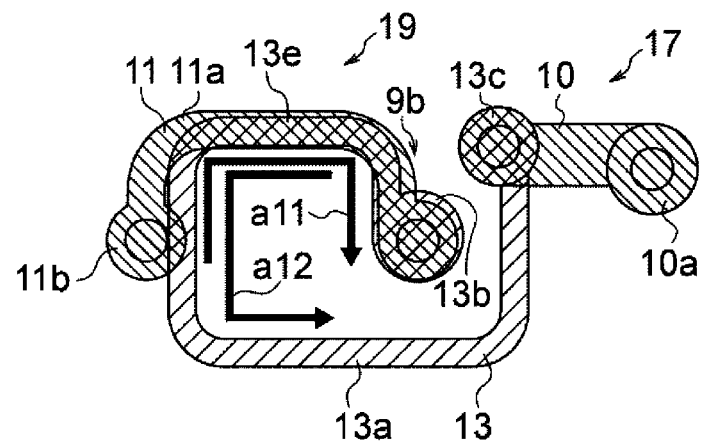

FIGS. 3A to 3C are plan views and illustrate the second example configuration of the first inductor 11 and the second inductor 13.

The second example configuration will be essentially described with a focus on the difference between the first example configuration and the second example configuration. Unless otherwise noted, the second example configuration may be equated with the first example configuration or may be understood by analogy to the first example configuration. Each element in the second example configuration and the corresponding element in the first example configuration may be denoted by the same reference sign, irrespective of possible differences therebetween.

The second example configuration involves inductive coupling that is opposite in direction to the inductive coupling in the first example configuration. As denoted by the arrows a11 and a12, the direction along the first coupling portion 11e from the common terminal 3 (the end portion 11b) toward the filters 7 (the end portion 11c) and the direction along the second coupling portion 13e from the signal line 9 (the end portion 13b) toward the reference potential part 15 (the end portion 13c) are opposite to each other in the second example configuration. The inductive coupling based on this relationship may be herein referred to as reverse inductive coupling.

As illustrated in the drawings, the second inductor 13 in the second example configuration is structurally identical to the second inductor 13 in the first example configuration. The orientation of the first inductor 11 in the second example configuration except for the end portions 11b and 11c and the orientation of the first inductor 11 in the first example configuration except for the end portions 11b and 11c are opposite to each other in the up-and-down direction on the drawing plane. It is not required that the second inductor 13 in the second example configuration be equal in shape, dimension, and position to the second inductor 13 in the first example configuration. The same holds for the first inductor 11.

With regard to the distance over which the first coupling portion 11e and the second coupling portion 13e extend in parallel and/or the distance over which the first coupling portion 11e and the second coupling portion 13e overlap each other, the second example configuration differs from the first example configuration in some respects. More specifically, the second example configuration differs from the first example configuration in that the entirety of the first line 11a extends parallel to (part of) the second line 13a. The first line 11a and the second line 13a *extending in parallel are each bent into a 90° angle at two points*. There is an overlap between the first line 11a and the second line 13a, and the overlap includes a portion extending substantially over the entire widths of these lines. This portion (extending to the end portion 11c of the first line 11a) is bent into a 90° angle at one point; that is, this portion extends in a manner so as to wind.

Examples of Actions Arising from Inductive Coupling

When the forward inductive coupling is provided between the first inductor 11 and the second inductor 13 as in the first example configuration (see FIG. 2C), the coupling between the signal line 9 and the reference potential part 15 is stronger than would be the case if no inductive coupling is provided. The characteristic impedance of the signal line 9 is reduced accordingly. Consequently, the impedance at the common terminal 3 of the filter device 1 is increased.

When the reverse inductive coupling is provided between the first inductor 11 and the second inductor 13 as in the second example configuration (see FIG. 3C), the characteristic impedance of the signal line 9 is higher than would be the case if no inductive coupling is provided. Consequently, the impedance at the common terminal 3 of the filter device 1 is reduced.

That is, the impedance at the common terminal 3 is adjustable through the selection between the forward inductive coupling and the reverse inductive coupling and through the control of the degree of the inductive coupling between the first inductor 11 and the second inductor 13. The impedance is to be adjusted in the direction of the real axis of a Smith chart as will be described below.

Example Results of Simulations

Simulation calculations were performed under specific conditions to analyze the characteristics of the filter device 1. The following describes example results obtained by the simulation calculations.

The filter device 1 subjected to analysis was a quadplexer. The quadplexer supported Band 1 (transmission band: 1,920 to 1,980 MHz, reception band: 2,100 to 2,170 MHz) and Band 3 (transmission band: 1,710 to 1,785 MHz, reception band: 1,805 to 1,880 MHz) for the universal mobile telecommunications system (UMTS).

Example 1 adopted the first example configuration. Example 2 adopted the second example configuration. The difference between Example 1 and Example 2 is only in the direction of the inductive coupling between the first inductor 11 and the second inductor 13. A comparative example for the Examples 1 and 2 involved no inductive coupling between the first inductor 11 and the second inductor 13.

Such a comparative example serves as a guide for product design. For example, when the impedance in the comparative example is below a target value, the first example configuration is to be adopted so as to provide a higher impedance. When the impedance in the comparative example is above the target value, the second example configuration is to be adopted so as to provide a lower impedance. The impedance in the given comparative example was below the target value.

Figure 4A:
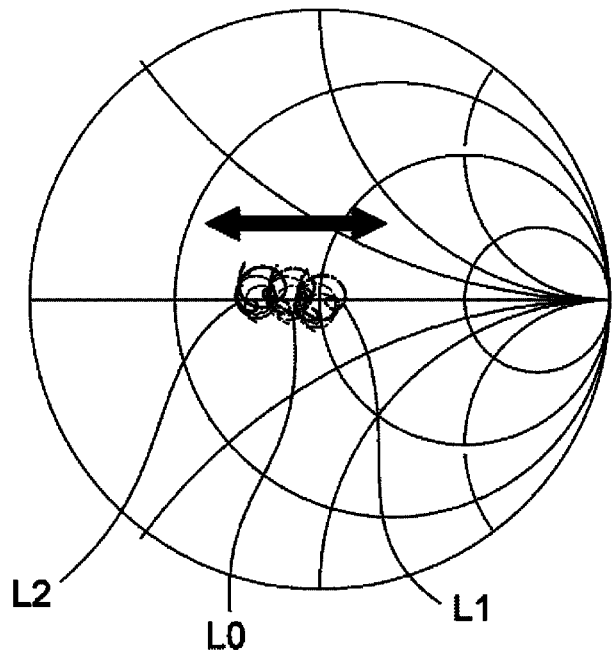
FIGS. 4A and 4B are Smith charts for the impedance of a filter device in an example, the impedance of a filter device in another example, and the impedance of a filter device in a comparative example.
Figure 4B:
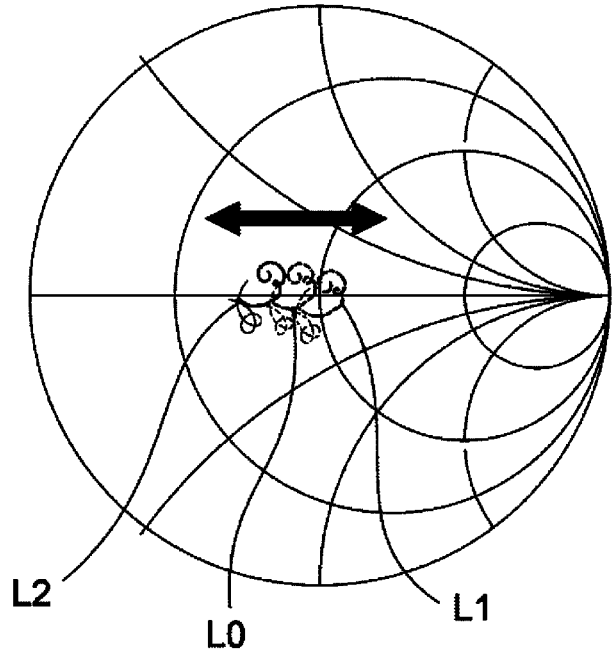

FIGS. 4A and 4B are Smith charts for the impedance at the common terminal 3. Different levels of impedance are provided at different frequencies. FIG. 4A illustrates an example of the impedance in the transmission band of Band 3, that is, in the lowest frequency range supported by the given quadplexer. FIG. 4B illustrates an example of the impedance in the reception band of Band 1, that is, in the highest frequency range supported by the given quadplexer.

With different levels of impedance being provided at different frequencies, the impedance in the frequency range concerned is denoted by a line in the Smith chart. A line L0 denotes values relevant to the comparative example. A line L1 denotes values relevant to Example 1. A line L2 denotes values relevant to Example 2. The same holds for FIGS. 5A to 7D, which will be described later. That is, the lines L0, L1, and L2 correspond to the comparative example, Example 1, and Example 2, respectively.

The results shown in FIGS. 4A and 4B confirmed that the impedance in Example 1 shifted toward a greater value along the real axis with respect to the impedance in the comparative example and that the impedance in Example 2 shifted toward a smaller value along the real axis with respect to the impedance in the comparative example.

Figure 5A:
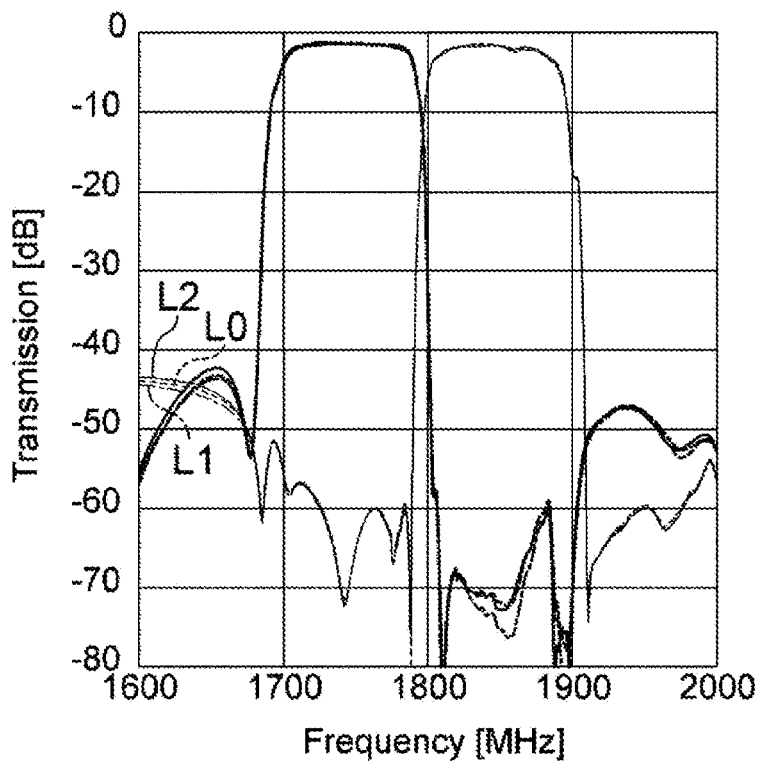
FIGS. 5A and 5B are graphs each illustrating the transmission characteristics of a quadplexer in an example, the transmission characteristics of a quadplexer in another example, and the transmission characteristics of a quadplexer in a comparative example.
Figure 5B:
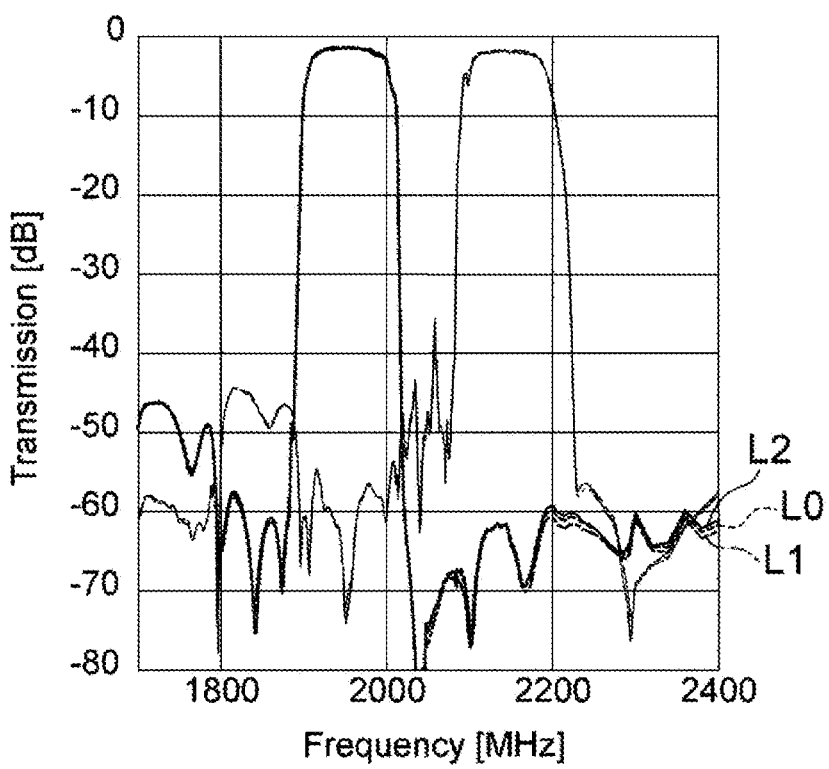
Figure 6A:
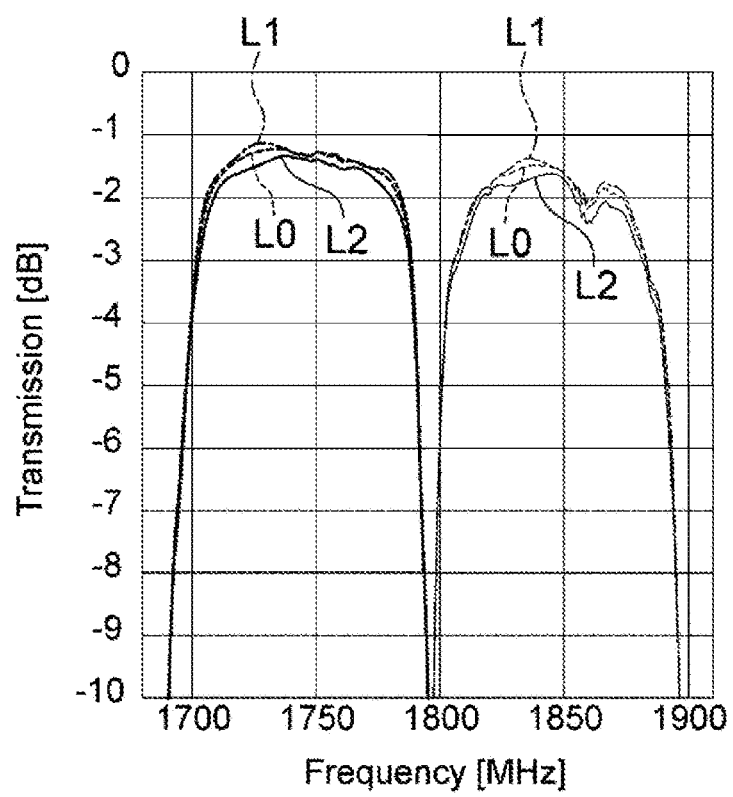
FIG. 6A is an enlarged graph corresponding to part of the graph in FIG. 5A.
Figure 6B:
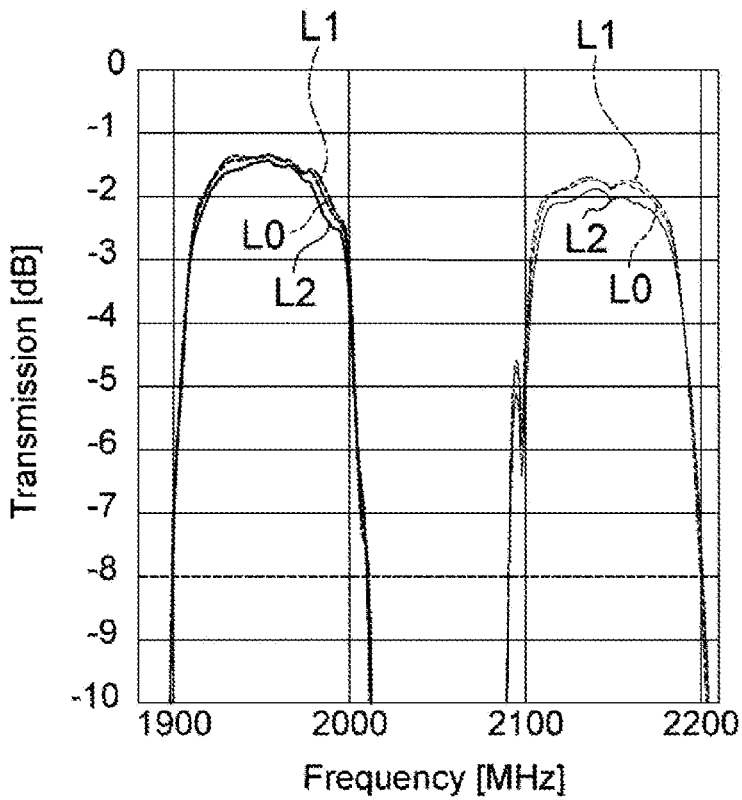
FIG. 6B is an enlarged graph corresponding to part of the graph in FIG. 5B.

FIGS. 5A, 5B, 6A, and 6B are graphs each illustrating the transmission characteristics of the quadplexer in Example 1, the transmission characteristics of the quadplexer in Example 2, and the transmission characteristics of the quadplexer in the comparative example. The horizontal axis of each graph represents the frequency (in units of MHz). The vertical axis of each graph represents the transmission characteristics (in units of dB). FIG. 5A illustrates the transmission characteristics in a frequency range including Band 3. FIG. 5B illustrates the transmission characteristics in a frequency range including Band 1. FIG. 6A is an enlarged graph corresponding to part of the graph in FIG. 5A. FIG. 6B is an enlarged graph corresponding to part of the graph in FIG. 5B.

Figure 7A:
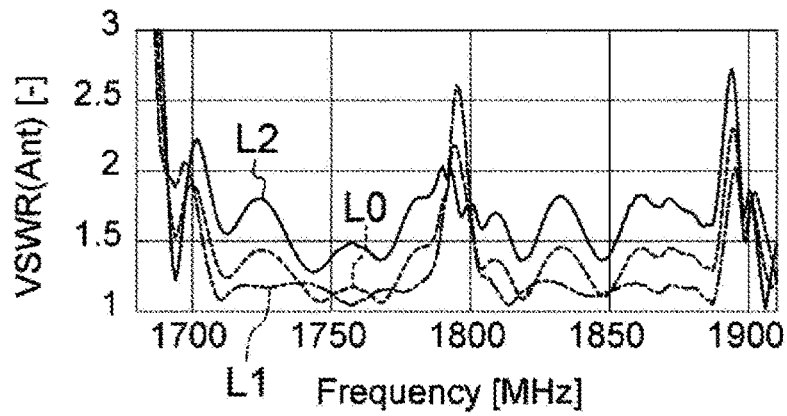
FIGS. 7A to 7D are graphs each illustrating the voltage standing wave ratio of a quadplexer in an example, the voltage standing wave ratio of a quadplexer in another example, and the voltage standing wave ratio a quadplexer in a comparative example.
Figure 7B:
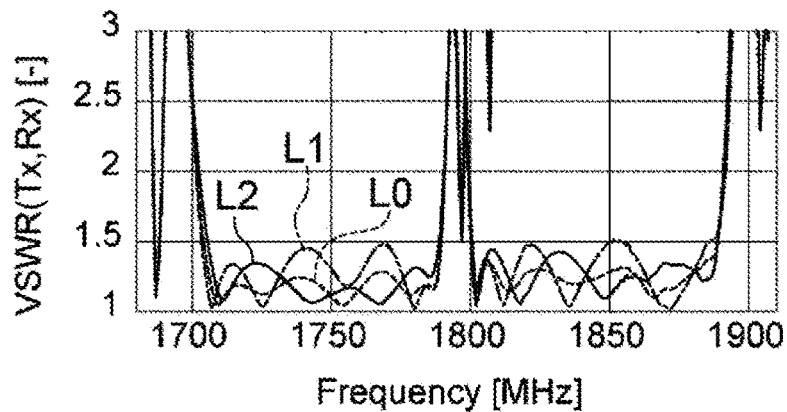
Figure 7C:
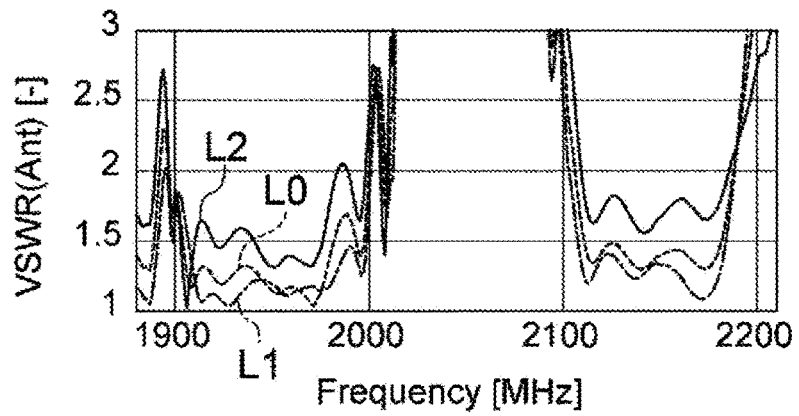
Figure 7D:
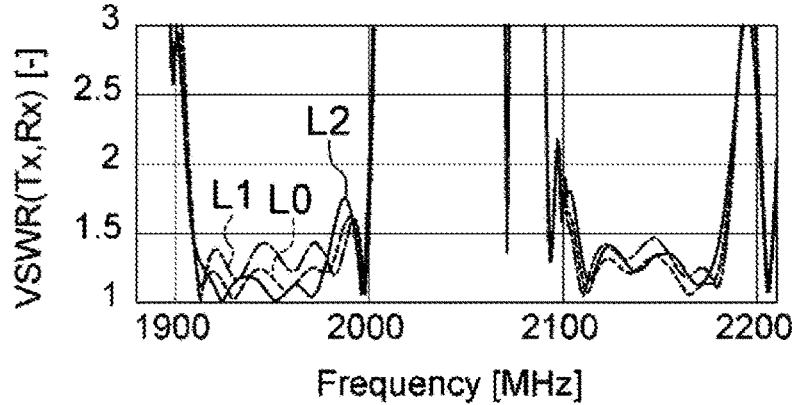

FIGS. 7A to 7D are graphs each illustrating the voltage standing wave ratio (VSWR) of the quadplexer in Example 1, the VSWR of the quadplexer in Example 2, and the VSWR of the quadplexer in the comparative example. The horizontal axis of each graph represents the frequency (in units of MHz). The vertical axis of each graph represents the VSWR (no unit required). FIG. 7A illustrates how the VSWR at the common terminal 3 varied in a frequency range including Band 3. FIG. 7B illustrates how the VSWR at the signal terminals 5 varied in the frequency range including Band 3. FIG. 7C illustrates how the VSWR at the common terminal 3 varied in a frequency range including Band 1. FIG. 7D illustrates how the VSWR the signal terminals 5 varied in the frequency range including Band 1.

As mentioned above, the impedance in the comparative example given in the simulations illustrated in the drawings was below the target value. Thus, Example 1 (denoted by the line L1) was superior to the comparative example (denoted by the line L0) in terms of impedance matching and, by extension, achieved a decrease in VSWR and a decrease in insertion loss. Example 2 (denoted by the line L2) provided a greater impedance mismatch than the comparative example and, by extension, exhibited an increase in VSWR and an increase in insertion loss.

Modifications

The following describes modifications of the embodiment above. The modifications will be essentially described with a focus on the difference between the filter device 1 according to the embodiment above and the modifications thereof. Unless otherwise noted, the following modifications and features that will be described thereafter may be equated with the embodiment above or may be understood by analogy to the embodiment above. Each element in the following modifications and the corresponding element in the embodiment above may be denoted by the same reference sign, irrespective of possible differences therebetween.

First Modification

Figure 8A:
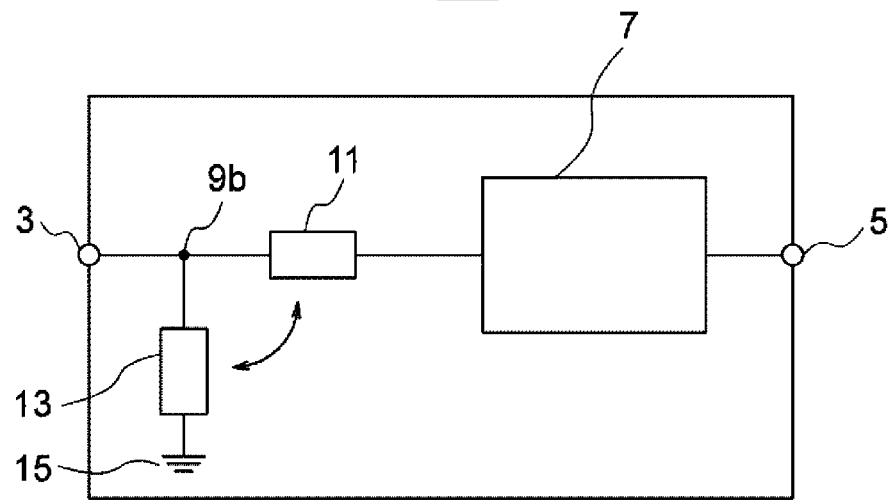
FIG. 8A is a block diagram illustrating the configuration of a filter device in a first modification.

FIG. 8A is a block diagram illustrating the configuration of a filter device 201 in a first modification.

The filter device 1 according to the embodiment above includes more than one filter 7. The filter device 201 includes only one filter 7. That is, the filter device 201 is simply a filter. Terminals in this modification that correspond to the common terminal 3 and the signal terminal 5 in the embodiment above are simply referred to as a terminal 3 and a terminal 5, respectively. The terminal 3 and the terminal 5 of the filter device 201 may be located on the input side and the output side, respectively. Alternatively, the terminal 3 and the terminal 5 of the filter device 201 may be located on the output side and the input side, respectively. In other words, the first inductor 11 and the second inductor 13 may be closer than the filter 7 to the input side or the output side.

Second Modification

Figure 8B:
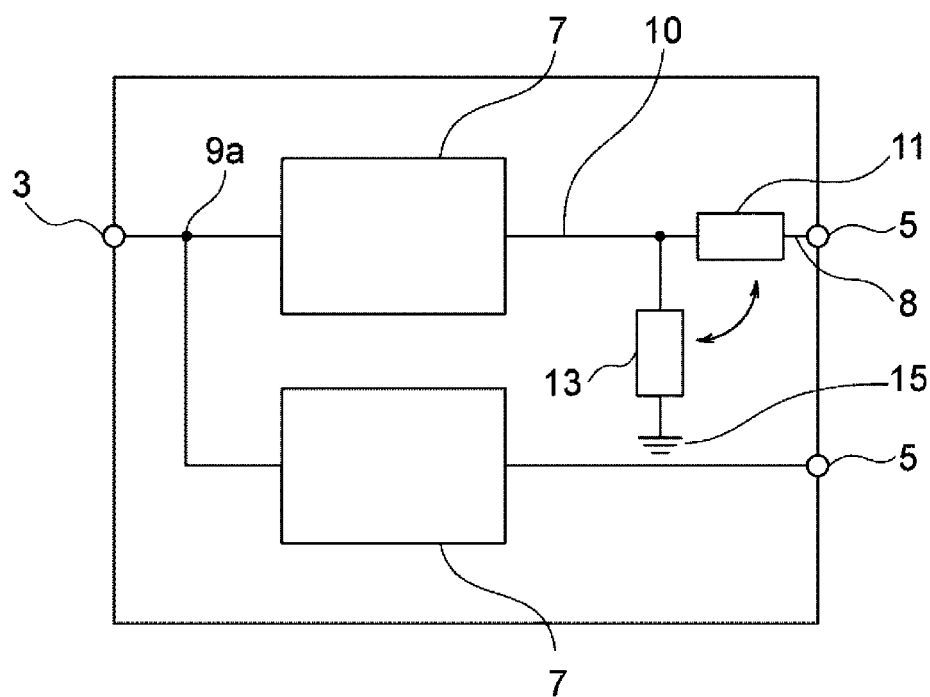
FIG. 8B is a block diagram illustrating the configuration of a filter device in a second modification.

FIG. 8B is a block diagram illustrating the configuration of a filter device 301 in a second modification. Although the filter device 301 illustrated in the drawing includes only two filters 7, the filter device 301 may include three or more filters 7.

The first inductor 11 and the second inductor 13 included in the filter device 1 according to the embodiment above are closer than the filters 7 to the common terminal 3. The first inductor 11 and the second inductor 13 included in the filter device 301 are closer than the filters 7 to the signal terminals 5.

More specifically, the first inductor 11 is included in a signal line 8, which forms a connection between one of the filters 7 and the signal terminal 5 corresponding to the filter 7 concerned. The second inductor 13 forms a connection between the signal line 8 and the reference potential part 15. The filter device 301 may include two signal lines 8 so as to output a balanced signal. In this case, the two signal lines 8 each may be connected with the first inductor 11 and the second inductor 13.

Third Modification

Figure 9:
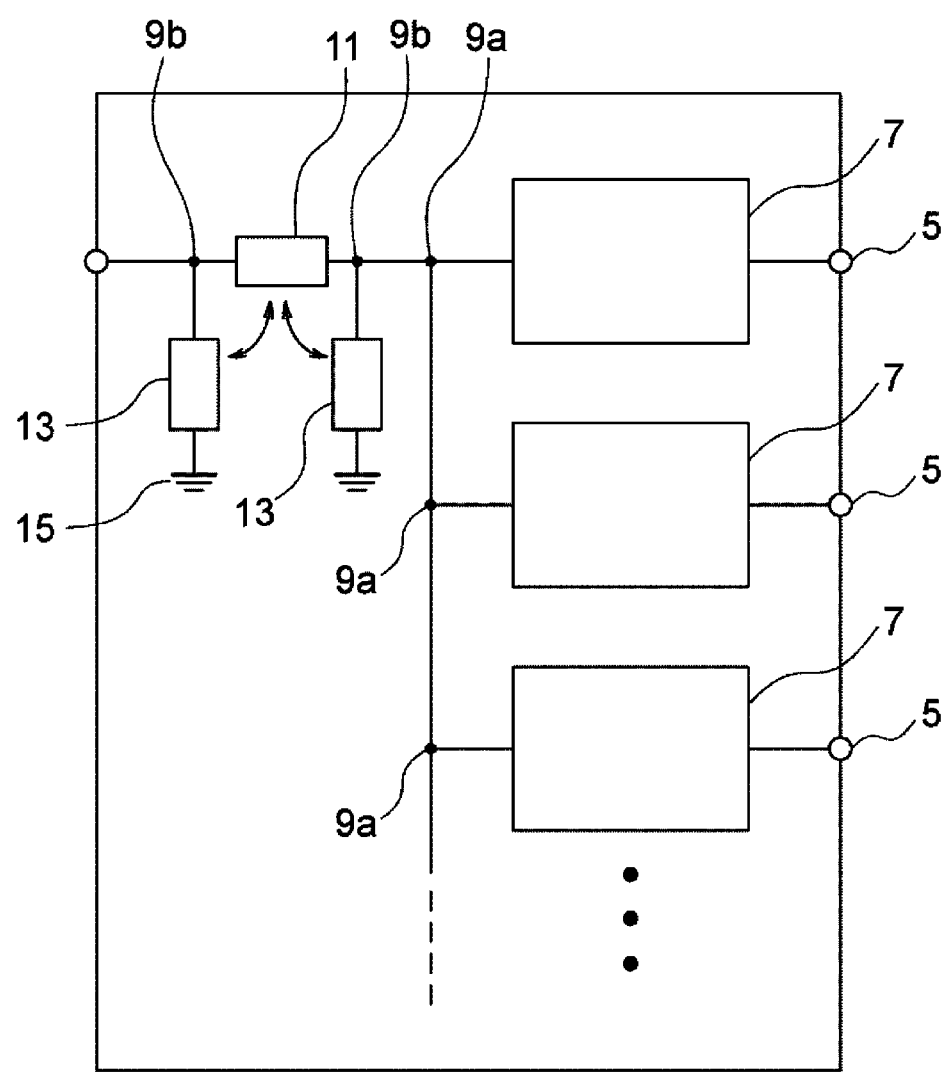
FIG. 9 is a block diagram illustrating the configuration of a filter device in a third modification.

FIG. 9 is a block diagram illustrating the configuration of a filter device 401 in a third modification. Although the filter device 401 illustrated in the drawing includes more than one filter 7, the filter device 401 may include only one filter 7 as in the first modification 1.

The filter device 1 according to the embodiment above includes one second inductor 13 connected to a point closer than the first inductor 11 to the common terminal 3 or the filters 7. The filter device 401 includes two second inductors 13. One of the two second inductors 13 is connected to a point closer than the first inductor 11 to the common terminal 3, and the other second inductor 13 is connected to a point closer than the first inductor 11 to the filters 7. Each of the two second inductors 13 is inductively coupled to the first inductor 11.

The two second inductors 13 may be inductively coupled to different portions of the first inductor 11 (e.g., different portions in the longitudinal direction of the first line 11a) or may be inductively coupled to the same portion of the first inductor 11. In the latter case, the two second inductors 13 may be included in the respective second conductor layers 19 stacked on opposite sides with respect to the first conductor layer 17 including the first inductor 11.

Example Configuration of Filters

The filters 7 may have any desired filter configuration (may be of any desired kind). The filters 7 may be acoustic wave filters, LC filters, cavity resonator filters, helical filters, or dielectric filters. Examples of such an acoustic wave filter include surface acoustic wave (SAW) filters, bulk acoustic wave (BAW) filters, boundary acoustic wave filters (which may be regarded as a kind of SAW filters), and film bulk acoustic resonator (FBAR) filters.

The following describes the configuration of a SAW filter that is an example of the filters 7. The term "SAW" in the following description may be read as acoustic wave, which is a superordinate of the term "SAW". The same holds for the term "SAW resonator" and other terminologies each including the term "SAW".

Configuration of SAW Resonator

Figure 10:
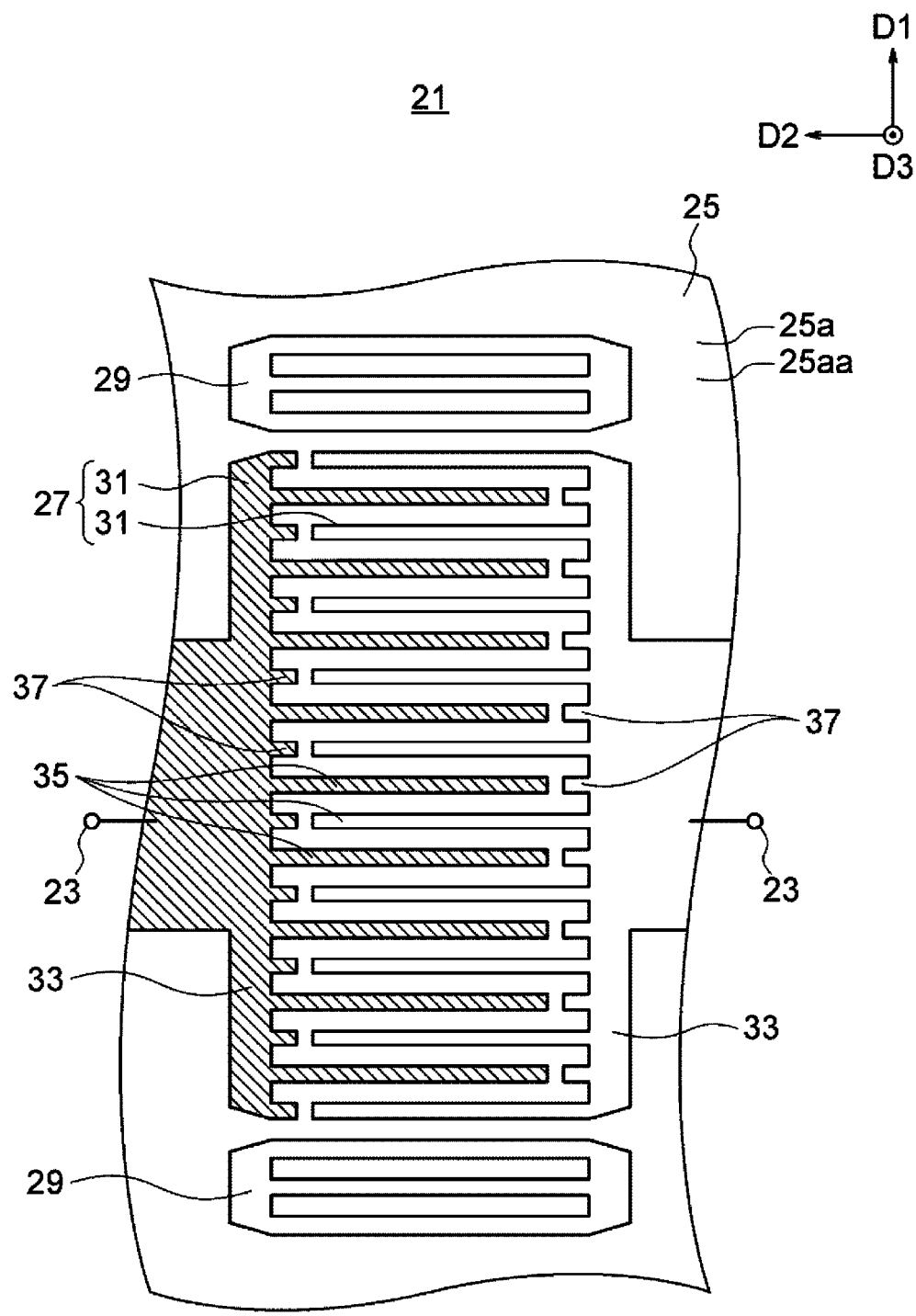
FIG. 10 is a plan view of a surface acoustic wave (SAW) resonator included in the filter device in FIG. 1, illustrating the configuration of the SAW resonator.

FIG. 10 is a plan view of a SAW resonator 21, illustrating the configuration thereof. The SAW resonator 21 is included in a SAW filter.

Although the up-and-down orientation of the SAW resonator 21 (filter 7) may be changed, the SAW resonator 21 will be described using the Cartesian coordinate system based on coordinates axes: D1, D2, and D3. For convenience, the word "upper surface", for example, will be used on the understanding that the positive side of the D3 axis (the front side of the drawing plane in FIG. 1) is located on the upper side. The D1 axis is defined as an axis extending parallel to the propagation direction of a SAW transmitted along an upper surface of a substrate 25, which will be described later. The upper surface refers to a surface on the front side of the drawing plane. In most cases, the surface concerned is (a main surface) larger than any other surface of the resonator. The D2 axis is defined as an axis extending parallel to the upper surface of the substrate 25 and being orthogonal to the D1 axis. The D3 axis is defined as an axis orthogonal to the upper surface of the substrate 25.

The SAW resonator 21 is a one-port SAW resonator. The SAW resonator 21 includes two terminals 23, which are schematically illustrated in the drawing. When an electrical signal in a predetermined frequency is input to the SAW resonator 21 through one of the terminals 23, the electrical signal resonates and is then output through the other terminal 23. The terminals 23 each may correspond to the common terminal 3, the signal terminal 5, or the reference potential part 15.

The SAW resonator 21 includes, for example, the substrate 25, an excitation electrode 27, and a pair of reflectors 29. The excitation electrode 27 is disposed on a main surface 25a of the substrate 25. The reflectors 29 are disposed on the main surface 25a and on opposite sides with the excitation electrode 27 therebetween.

Strictly speaking, the SAW resonator 21 includes the substrate 25, as mentioned above. However, there may be cases where a plurality of SAW resonators 21 are provided (see FIG. 11) in such a manner that a plurality of modules each being a combination of an excitation electrode 27 and a pair of reflectors 29 are disposed on the same substrate 25. This configuration will be described later. For convenience, the modules each being a combination of an excitation electrode 27 and a reflector 29 (electrode portions of the SAW resonator 21) each may be hereinafter referred to as a SAW resonator 21.

At least part of the main surface 25a of the substrate 25 or, more specifically, a predetermined region 25aa is piezoelectric. The entirety of the substrate 25 may be made of a piezoelectric material; that is, the substrate 25 may be a piezoelectric substrate. Alternatively, the substrate 25 may be a laminated substrate. The laminated substrate includes a piezoelectric substrate and a support substrate. The piezoelectric substrate has the main surface 25a and is made of a piezoelectric material. The support substrate is bonded to a surface opposite to the main surface 25a of the piezoelectric substrate with an adhesive or is bonded directly to the surface without an adhesive therebetween. Still alternatively, the substrate 25, in which the predetermined region 25aa is piezoelectric, may include a support substrate and a film laid over all or part of a main surface on the +D3 side of the support substrate. The film is (a piezoelectric film) made of a piezoelectric material or is a multilayer film including a piezoelectric film.

The piezoelectric material of which the substrate 25 or the predetermined region 25aa of the substrate 25 is made is for example, a piezoelectric single-crystal material. Examples of the single-crystal material include lithium tantalate ($LiTaO_3$), lithium niobate ($LiNbO_3$), and quartz ($SiO_2$). The cut-angle, the planar shape, and dimensions of the single-crystal material may be specified as appropriate.

The excitation electrode 27 and the reflectors 29 may be a layered conductor on the substrate 25. For example, the excitation electrode 27 and the reflectors 29 are made of the same material and are equal in thickness. The layered conductor may be metal. Examples of metal that may be used as the layered conductor include Al or Al alloy, namely, an alloy containing Al as a principal component. The Al alloy may be an Al—Cu alloy. The layered conductor may include metal layers. The layered conductor may have any desired thickness to meet requirements as to the electrical characteristics and the like of the SAW resonator 21. For example, the thickness of the layered conductor is greater than or equal to 50 nm and less than or equal to 600 nm.

The excitation electrode 27 includes a pair of comb teeth-shaped electrodes 31. One of the comb teeth-shaped electrodes 31 is hatched for increased visibility. The comb teeth-shaped electrodes 31 each include a busbar 33, electrode fingers 35, and dummy electrodes 37. The electrode fingers 35 extend in parallel from the busbar 33. The dummy electrodes 37 are each located between two adjacent ones of the electrode fingers 35 and protrude from the busbar 33. The pair of comb teeth-shaped electrodes 31 is disposed in such a manner that the electrode fingers 35 interdigitate (in a staggered configuration).

The pair of comb teeth-shaped electrodes 31 energized with a voltage causes the electrode fingers 35 to apply a voltage to the predetermined region 25aa such that a SAW in a predetermined mode is excited to propagate in the direction of the D1 axis. The excited SAW is reflected by the electrode fingers 35 in a mechanical manner. This reflection induces a standing wave whose half wavelength is equal to the pitch of the electrode fingers 35. The reflectors 29 reduce the occurrence of leakage of the SAW that forms the standing wave. The standing wave is converted into an electrical signal equal in frequency to the standing wave and is then picked up by the electrode fingers 35. In this way, the SAW resonator 21 acts as a resonator. The resonant frequency of the SAW resonator 21 is substantially equal to the frequency of the SAW propagating through the predetermined region 25aa, with the half wavelength of the SAW being equal to the electrode finger pitch.

An example configuration of the excitation electrode 27 is schematically illustrated in FIG. 10. The excitation electrode 27 may have any specific desired configuration, and/or the configuration of the excitation electrode 27 may be changed as appropriate. Any desired number of electrode fingers 35 may be provided, and each electrode finger 35 may have desired dimensions. The pitch of the electrode fingers 35 may be constant or may vary slightly, or some of the electrode fingers 35 may be arranged with a distinctive pitch (e.g., a tighter pitch). The busbar 33 may extend in the direction of the D1 axis as in the drawing. Alternatively, the busbar 33 may be inclined relative to the direction of the D1 axis. The excitation electrode 27 may optionally include the dummy electrodes 37. The distance between tips of two adjacent electrode fingers in the direction of the D2 axis, that is, the intersecting width of the electrode fingers may be constant as illustrated in the drawing. Alternatively, the intersecting width may vary in the direction of the D1 axis; that is, apodization may be applied to the electrode fingers. Still alternatively, a small number of electrode fingers 35 may be removed in some places so as to substantially thin out the electrode fingers 35.

The main surface 25a of the substrate 25 may be overlaid with a protective film (not illustrated) made of, for example, $SiO_2$. The protective film is laid so as to cover the excitation electrode 27 and the reflectors 29. The protective film may be thicker or thinner than the excitation electrode 27. The protective film may be used in combination with an additional film made of an insulating material or metal. The additional film may be laid on upper or lower surfaces of the excitation electrode 27 and the reflectors 29 for the purpose of increasing the reflection coefficient of a SAW.

SAW Filters and Duplexers

Figure 11:
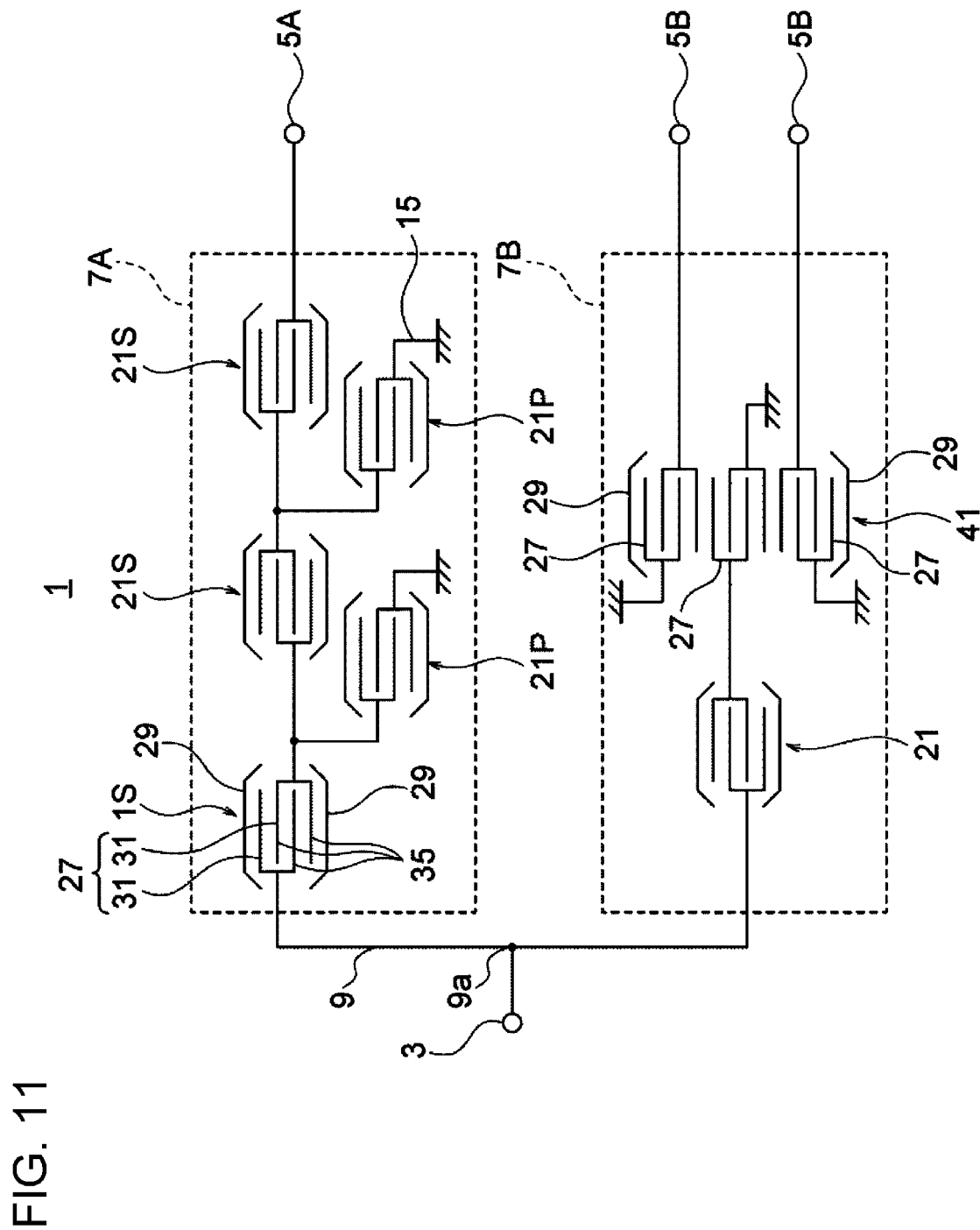
FIG. 11 is a circuit diagram schematically illustrating the configuration of a duplexer that is an example of the filter device illustrated in FIG. 1.

FIG. 11 is a circuit diagram schematically illustrating the configuration of a duplexer adopted as the filter device 1.

The first inductor 11 and the second inductor 13 are not illustrated in FIG. 11, the main focus of which is the configuration of SAW filters. While being denoted by 31 and 29 on the upper left of the drawing plane, each comb teeth-shaped electrode is schematically illustrated in the form of a bifurcated fork, and each reflector is schematically illustrated in the form of a line segment having two bent ends.

A transmitting filter 7A and a receiving filter 7B in the drawing are examples of the filters 7. A transmission terminal 5A and a pair of reception terminals 5B in the drawing are examples of the terminals 5. The transmitting filter 7A filters a transmission signal input through the transmission terminal 5A and outputs the resultant signal to the common terminal 3. The receiving filter 7B filters a reception signal input through the common terminal 3 and outputs the resultant signal to the pair of reception terminals 5B.

The transmitting filter 7A is, for example, a ladder SAW filter. More specifically, the transmitting filter 7A includes (one or more) series resonators 21S and one or more parallel resonators 21P. The series resonators 21S are connected in series with and between the transmission terminal 5A and the common terminal 3. The parallel resonators 21P each form a connection between the reference potential part 15 and the path on which the series resonators 21S are connected in series. The series resonators 21S and the parallel resonators 21P each may be structurally identical to the SAW resonator 21 described above with reference to FIG. 10.

The receiving filter 7B includes, for example, the SAW resonator 21 and a SAW filter 41, which is a multimode SAW filter and connected in series with the SAW resonator 21. The SAW filter 41 includes excitation electrodes 27 and a pair of reflectors 29. In the example illustrated in the drawing, three excitation electrodes 27 are included. The excitation electrodes 27 are arranged in the propagation direction of an acoustic wave. The reflectors 29 are disposed on opposite sides with the excitation electrodes 27 therebetween.

The transmitting filter 7A and the receiving filter 7B (i.e., the filters 7) may be disposed on the same substrate 25 or may be disposed on the respective substrates 25. In some embodiments, each filter 7 may be distributed among several substrates 25.

Unlike the receiving filter 7B in FIG. 11, which illustrates an example configuration of the filter device 1, the receiving filter 7B may be structurally identical to the transmitting filter 7A; that is, the receiving filter 7B may be a ladder filter. As mentioned above, the filter device concerned may include only one filter 7 or three or more filters 7.

Example Structures of Filter Device

Various structures including well-known structures may be adopted into the package of the filter device 1. Similarly, various structures including well-known structures (with or without conductor layers) may be adopted into the first inductor 11 and the second inductor 13. The following describes example structures of the package and example structures of the inductors.

First Example Structure

Figure 12:
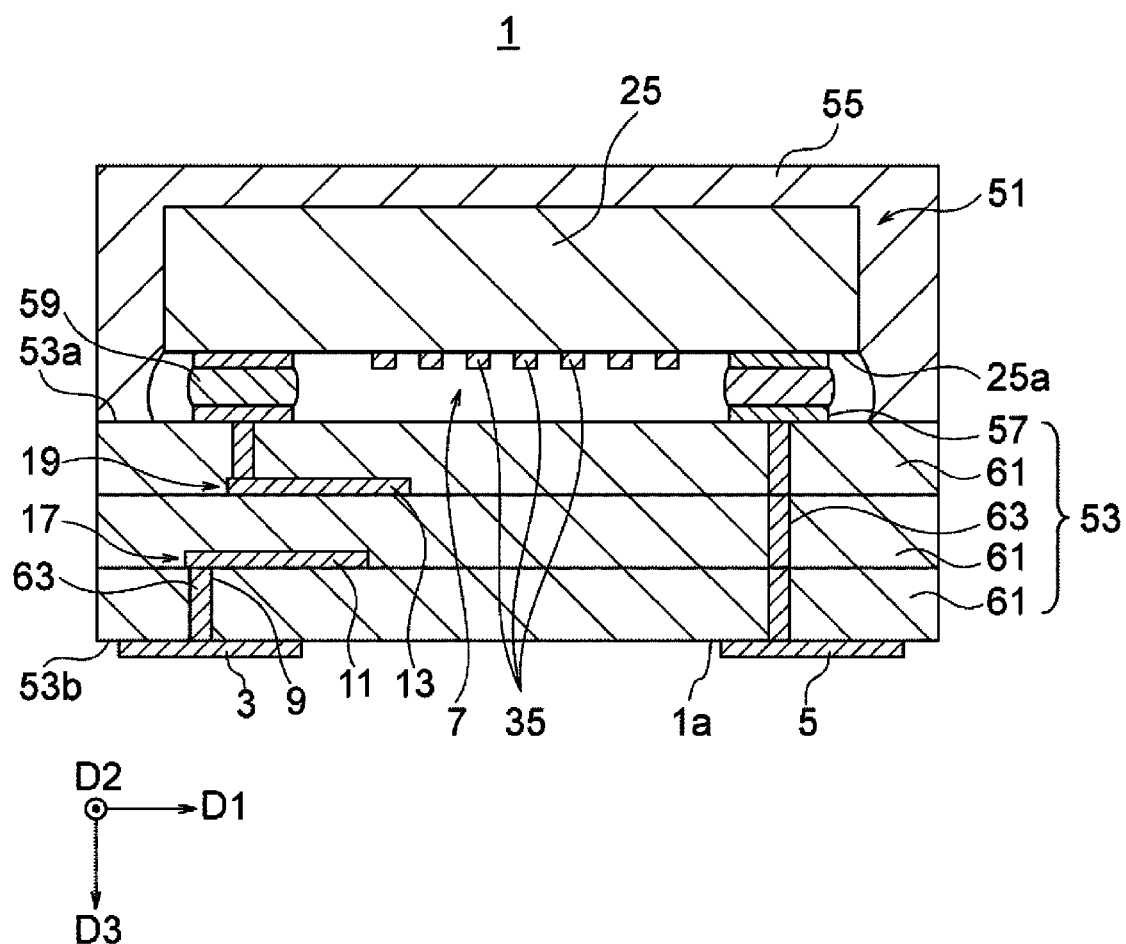
FIG. 12 is a sectional view of the filter device illustrated in FIG. 1, schematically illustrating a first example structure of the filter device.

FIG. 12 is a sectional view of the filter device 1, schematically illustrating a first example structure of the filter device 1.

The filter device 1 in this example includes a chip 51, a substrate 53, and a sealing part 55. One or more filters 7 are at least partially disposed on the chip 51. The chip 51 is mounted on the substrate 53 and is sealed with the sealing part 55.

The chip 51 includes the substrate 25 described above. At least one filter 7 is disposed on the main surface 25a of the substrate 25. The chip 51 is disposed in such a manner that the main surface 25a faces a main surface 53a of the substrate 53 with a space therebetween. The chip 51 is mounted on the substrate 53 in such a manner that terminals (not denoted by any reference sign) on the main surface 25a are bonded to pads 57 on the main surface 53a with bumps 59 (e.g., solder bumps) therebetween. The sealing part 55 may be obtained in such a manner that uncured resin is applied to the chip 51 mounted on the substrate 53 and is then cured. Although only one chip 51 is mounted on the substrate 53 in the example illustrated in the drawing, more than one chip 51 may be mounted on the substrate 53.

The substrate 53 is, for example, a multilayer substrate. More specifically, the substrate 53 may include two or more insulating layers 61, through-conductors 63, and conductor layers (denoted by 17 and 19, respectively). The through-conductors 63 each extend through one or more insulating layers 61. Each of the conductor layers is laid on a surface of the corresponding one of the insulating layers 61. The common terminal 3, the signal terminals 5, and the reference potential terminal (not illustrated) are conductor layers (not denoted by any reference sign) on a main surface 53b of the substrate 53. The main surface 53b is located on the side opposite to the side on which the chip 51 is mounted. The signal line 9 (part of the signal line 9), the first inductor 11, and the second inductor 13 are the conductor layers and/or the through-conductors 63 included in the substrate 53 and are electrically connected to the at least one filter 7 with the pads 57 being located between the substrate 53 and the at least one filter 7.

More specifically, the first conductor layer 17 (the first inductor 11) and the second conductor layer 19 (the second inductor 13) in the example illustrated in the drawing are each located between two insulating layers 61 stacked on each other. That is, the first conductor layer 17 and the second conductor layer 19 are located within the substrate 53. The first conductor layer 17 and the second conductor layer 19 are located on opposite sides with one of the insulating layers 61 therebetween.

In some embodiments (not illustrated), the up-and-down relationship between the first conductor layer 17 and the second conductor layer 19 in the example illustrated in the drawing may be inverted. The first conductor layer 17 and the second conductor layer 19 may be located on opposite sides with two or more of the insulating layers 61 therebetween. The first conductor layer 17 or the second conductor layer 19 may be disposed on the main surface 53a or 53b of the substrate 53. Each of the first conductor layer 17 and the second conductor layer 19 may be disposed on the corresponding one of the main surfaces of the substrate 53. The substrate 53 may include a conductor layer disposed on the main surface 53a and a conductor layer disposed on the main surface 53b, with no conductor layer being disposed in the substrate 53; that is, the substrate may be a double-sided printed board.

The first inductor 11 and the second inductor 13 in the example described above are conductor layers arranged in a stack. In some embodiments, both the first inductor 11 and the second inductor 13 may be disposed in the same conductor layer, with their respective coupling portions extending in parallel within the conductor layer. Alternatively, the first inductor 11 and the second inductor 13 may be the through-conductors 63 and/or conductor layers on a side surface of the substrate 53, with their respective coupling portions extending in parallel in the same plane that extends along the D2 and D3 axes. Still alternatively, the first inductor 11 and the second inductor 13 may be disposed on the chip 51 and the substrate 53, respectively, or the first inductor 11 and the second inductor 13 may be disposed on the substrate 53 and the chip 51, respectively.

Second Example Structure

Figure 13:
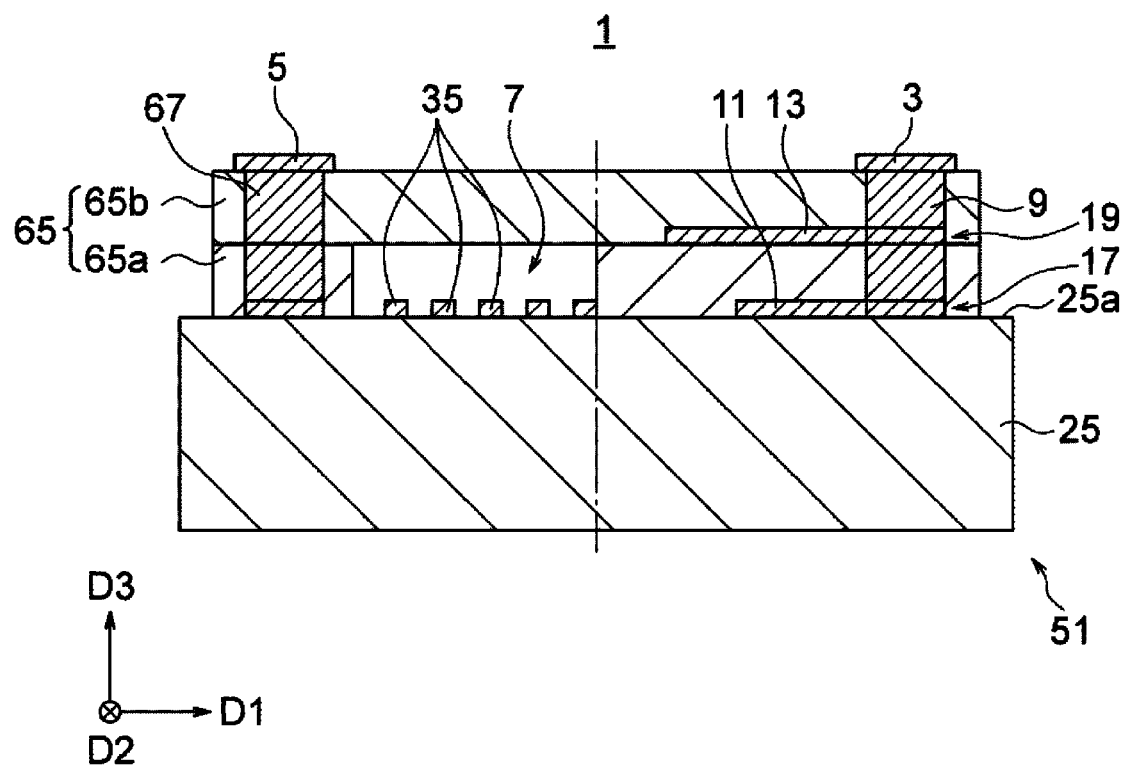
FIG. 13 is a sectional view of the filter device illustrated in FIG. 1, schematically illustrating a second example structure of the filter device.

FIG. 13 is a sectional view of the filter device 1, schematically illustrating a second example structure of the filter device 1. A dash-dot line in FIG. 13 divides the sectional view into two sections. The section on the right and the section on the left are located in different places in a plane extending along the D1 and D2 axes and/or are inclined at different angles.

The filter device 1 in this example is a chip that is packaged using the wafer level packaging (WLP). More specifically, the filter device 1 includes a chip 51, a cover 65, and through-conductors 67. One or more filters 7 are at least partially disposed on the chip 51. The main surface 25a of the chip is covered with the cover 65. The through-conductors 67 extend through the cover 65.

As with the chip 51 having the first example structure (see FIG. 12), the chip 51 in this example includes the substrate 25 described above. At least one filter 7 is disposed on the main surface 25a of the substrate 25. The cover 65 includes, for example, a frame part 65a and a lid part 65b. The frame part 65a is disposed on the main surface 25a. The lid part 65b is disposed on the frame part 65a to close a cavity defined by the frame part 65a. The cavity defined by the frame part 65a includes a space extending over the at least one filter 7. Insulating layers constituting the cover 65 (the frame part 65a and the lid part 65b) are made of, for example, a thermosetting resin. The through-conductors 67 are located on terminals (not denoted by any reference sign) on the main surface 25a and extend through the frame part 65a and the lid part 65b.

The common terminal 3, the signal terminals 5, and the reference potential terminal (not illustrated) are conductor layers on the lid part 65b. These terminals are connected to upper ends of the through-conductors 67 and are electrically connected to the at least one filter 7 accordingly. The signal line 9 includes, for example, a conductor layer on the main surface 25a (the first conductor layer 17 in the example illustrated in the drawing) and the through-conductor 67.

At least one of the first inductor 11 and the second inductor 13 is a conductor located within the cover 65 or on a surface of the cover 65 (other than a surface on the main surface 25a). The second inductor 13 in the example illustrated in the drawing is included in the second conductor layer 19 located between the frame part 65a and the lid part 65b. The first inductor 11 is included in the first conductor layer 17 located on the main surface 25a. The second inductor 13 and the first inductor 11 are located on opposite sides with the frame part 65a therebetween.

In some embodiments (not illustrated), the up-and-down relationship between the first conductor layer 17 and the second conductor layer 19 in the example illustrated in the drawing may be inverted. For example, a through-conductor extending through the frame part 65a and a through-conductor extending through the lid part 65b may be shifted apart from each other along a plane extending along the D1 and D2 axes. These conductors are connected to each other by the first inductor 11, in which case the first inductor 11 is a conductor located between the frame part 65a and the lid part 65b. The cover 65 may include three or more insulating layers stacked on top of one another. The first conductor layer 17 or the second conductor layer 19 may be disposed on an upper surface of the cover 65. Both the first conductor layer 17 and the second conductor layer 19 may be disposed within the cover 65 or may be disposed within the cover 65 and on the upper surface of the cover 65. The first conductor layer 17 and the second conductor layer 19 may be disposed on opposite sides with two or more insulating layers and/or the entirety of the cover 65 in the thickness direction thereof being located between the first conductor layer 17 and the second conductor layer 19. It is not required that the conductor layers be located within the cover 65.

The first inductor 11 and the second inductor 13 in the example described above are conductor layers arranged in a stack. Alternatively, both the first inductor 11 and the second inductor may be disposed in the same conductor layer, with their respective coupling portions extending in parallel within the conductor layer. Still alternatively, the first inductor 11 and the second inductor 13 may be the through-conductors 67 and/or conductor layers on a side surface of the cover 65, with their respective coupling portions extending in a plane that extends along the D2 and D3 axes. The terminals (including the terminals 3 and 5) of the filter device 1 may be located on the main surface 25a and exposed through the respective through-holes in the cover 65.

Third Example Structure

FIG. 14 is a sectional view of the filter device 1, schematically illustrating a third example structure of the filter device 1.

As with the filter device 1 having the first example structure, the filter device 1 having the third example structure includes a chip 51, a substrate 53, and a sealing part 55. At least one filter 7 is disposed on the chip 51. The chip 51 is mounted on the substrate 53 and is sealed with the sealing part 55. The substrate 53 includes conductors (not illustrated) each of which forms an electrical connection between the chip 51 and the corresponding one of the terminals (the common terminal 3 and the signal terminals 5). Unless otherwise noted, the third example structure may be equated with the first example structure or may be understood by analogy to the first example structure.

The first inductor 11 and the second inductor 13 in the first configuration example are conductors included in the substrate 53. At least one of the first inductor 11 and the second inductor 13 in the third example structure is a chip inductor mounted on the substrate 53. In the example illustrated in the drawing, both the first inductor 11 and the second inductor 13 are chip inductors mounted on the substrate 53. Each of these chip inductors is mounted on the substrate 53 in such a manner that two terminals (not denoted by any reference sign) located away from each other are bonded to the two respective pads 57 with two bumps 59, each of which is located between the corresponding terminal and the corresponding pad 57. Referring to FIG. 14, one of the two terminals of each chip inductor is hidden behind the other terminal and is thus not illustrated.

Various structures including well-known structures may be adopted as the internal structure of the chip inductors. Although the internal structure of the chip inductors is not illustrated, the chip inductors each may include a conductive wire (not illustrated). The conductive wires wind when viewed in the direction in which the two terminals are arranged (in the direction of the D2 axis in the example illustrated in the drawing), or the conductive wires wind when viewed in the direction of the D3 axis. The number of winding turns formed by each wire may be less than one or may be more than or equal to one. Typical chip inductors each include a wire forming more than one winding turn. When viewed in the direction of the central axis of the winding turns, the wire may be wound in multiple layers or in a single layer.

The first inductor 11 and the second inductor 13 each being in the form of a chip inductor are mounted so as to be adjacent to each other. Moreover, a portion being part of the wire in the first inductor 11 and closer than other portions of the wire to the second inductor 13 extends parallel to a portion being part of the wire in the second inductor 13 and closer than the other portions of the wire to the first inductor 11. The first inductor 11 and the second inductor 13 are inductively coupled to each other accordingly. The distance between the wire in the first inductor 11 and the wire in the second inductor 13 may be understood as analogous to the distance between the first coupling portion 11e and the second coupling portion 13e described above with reference to FIGS. 2C and 3C. A tailor-made chip inductor including the first inductor 11 and the second inductor 13 may be mounted on the substrate 53.

Communication Apparatus

FIG. 15 is a block diagram illustrating a principal part of a communication apparatus 151, into which the filter device 1 is adopted. The communication apparatus 151 is configured to perform wireless communications using radio waves. The communication apparatus 151 includes the filter device 1. The filter device 1 in the following example is the duplexer described above with reference to FIG. 11.

The communication apparatus 151 includes a radio-frequency integrated circuit (RF-IC) 153. The RF-IC 153 processes a transmission information signal TIS, which includes information that is to be transmitted. More specifically, the RF-IC 153 modulates the transmission information signal TIS and increases the frequency of the transmission information signal TIS such that the transmission information signal TIS is converted into a transmission signal TS, which is a radio-frequency signal having a carrier wave frequency. The transmission signal TS is then filtered by a band-pass filter 155 such that spurious components in the frequency ranges outside the transmission passband are removed from the transmission signal TS. The resultant signal is amplified by an amplifier 157 and is input to the filter device 1 (through the transmission terminal 5A). The filter device 1 (the transmitting filter 7A) removes, from the transmission signal TS input thereto, spurious components in the frequency ranges outside the transmission passband and outputs the resultant transmission signal TS to an antenna 159 through the common terminal 3. The electrical signal (the transmission signal TS) input to the antenna 159 is converted into a radio signal (a radio wave) and is then transmitted.

The communication apparatus 151 receives a radio signal (a radio wave) through the antenna 159. The radio signal input to the antenna 159 is converted into an electrical signal (a reception signal RS) and is then input to the filter device 1 (through the common terminal 3). The filter device 1 (the receiving filter 7B) removes, from the reception signal RS input thereto, spurious components in the frequency ranges outside the reception passband and outputs the resultant reception signal RS to an amplifier 161 through the reception terminals 5B. The reception signal RS output to the amplifier 161 is amplified by the amplifier 161 and is then filtered by a band-pass filter 163, in which spurious components in the frequency ranges outside the reception passband are removed from the reception signal RS. The reception signal RS is then processed by the RF-IC 153, which reduces the frequency of the reception signal RS and demodulates the reception signal RS such that the reception signal RS is converted into a reception information signal RIS.

The transmission information signal TIS and the reception information signal RIS each may be a low-frequency signal (a baseband signal) that carries relevant information. Examples of such a signal include an analog audio signal and a digital audio signal. The passband for radio signals may be set as appropriate, for example, in accordance with various well-known standards. The modulation system to be adopted may be phase modulation, amplitude modulation, frequency modulation, or a combination of two or more of these. Although the circuit architecture in the example illustrated herein adopts the direct conversion system, any appropriate circuit architecture such as the double superheterodyne system may be adopted. FIG. 15 schematically illustrates the principal part only. A low-pass filter and an isolator may be additionally included and placed in appropriate locations. The positions of the amplifiers and the other components may be changed.

As mentioned above, the filter device 1 includes a port (e.g., the common terminal 3), the reference potential part 15, the at least one filter 7, the signal line 9, the first inductor 11, and the at least one second inductor 13. A signal is input through the common terminal 3, and/or a signal is output through the common terminal 3. The reference potential part 15 is placed at a reference potential. The at least one filter 7 filters a signal. The signal line 9 forms a connection between the common terminal 3 and the at least one filter 7. The first inductor 11 is at least part of the signal line 9. The at least one second inductor 13 forms a connection between the signal line 9 and the reference potential part 15. The first inductor 11 and the at least one second inductor 13 are inductively coupled to each other.

The impedance may thus be adjusted in the direction of the real axis as described above with reference to FIGS. 4A to 7D. Known techniques for adjusting the impedance in the direction of the real axis each necessitate a circuit in which one or more inductors and one or more capacitors are used in combination. A filter device including such a circuit is large in size. When viewed from another perspective, it is required that the circuit be disposed outside the filter device. The present embodiment can address this problem in the following manner: part of the signal line 9, which is necessarily included in the filter device, is inductively coupled to the at least one second inductor 13, thus obviating for the need for an additional inductor. Such a filter device is advantageously compact as compared with conventional filters each including the aforementioned circuit. When viewed from another perspective, the present embodiment can reduce the necessity for an impedance matching circuit outside the filter device. It is highly probable that the filter device according to the present embodiment has a cost advantage. Furthermore, the present embodiment reduces the possibility of insertion loss that would be otherwise caused by a circuit added to such a conventional filter.

The first inductor 11 and the at least one second inductor 13 according to the present embodiment includes the first line 11a and the second line 13a, respectively. The first line 11a and the second line 13a include the first coupling portion 11e and the second coupling portion 13e, respectively. The first coupling portion 11e and the second coupling portion 13e extend in parallel to provide inductive coupling between the first line 11a and the second line 13a.

In this case, the first inductor 11 and/or the at least one second inductor 13 each may simply be an interconnection or each may be analogous to such an interconnection. It is highly probable that the aforementioned effect of reducing the size, the cost and/or the insertion loss will be produced.

The filter device 1 according to the present embodiment also includes the first conductor layer 17 and the second conductor layer 19 that are arranged in a stack. The first line 11a is included in the first conductor layer 17. The second line 13a is included in the second conductor layer 19. The first coupling portion 11e and the second coupling portion 13e overlap each other when viewed in plan through the first conductor layer 17 and the second conductor layer 19.

In this case, the first inductor 11 and the at least one second inductor 13 may be formed by patterning the respective conductor layers. The first inductor 11 and the second inductor 13 may thus be easily built in a chip that is to be formed into the filter device 1. These inductors may be conductor layers in the substrate 53 (see FIG. 12) or each may be a conductor layer on the main surface 25a of the substrate 25 or a conductor layer on the upper surface of the cover 65 (see FIG. 13). That is, already-existing conductor layers may be formed into the inductors. It is thus highly probable that the aforementioned effect of reducing the size and/or the cost will be produced. The degree of the inductive coupling is adjustable by changes in the distance between the first inductor 11 and the at least one second inductor 13 or, more specifically, by changes in the thickness of the insulating properties between the conductor layers.

The second line 13a in the present embodiment includes a winding section when viewed in plan. At least part of the winding section is the second coupling portion 13e.

In this case, the second line 13a is relatively long. It can thus be easily ensured that the second line 13a is long enough to be inductively coupled to the first line 11a. As a result, the impedance is adjustable over a wide range, and greater design flexibility is provided accordingly.

As with the second line 13a, the first line 11a in the present embodiment includes a winding section when viewed in plan. At least part of the winding section is the first coupling portion 11e.

In this case, it can be easily ensured that the second line 13a and the first line 11a are long enough to be inductively coupled to each other. As a result, the impedance is adjustable over a wider range.

The first coupling portion 11e and the second coupling portion 13e in the present embodiment extend in parallel and wind along with each other.

In this case, the first coupling portion 11e and the second coupling portion 13e are inductively coupled to each other not only due to the two lines extending in parallel but also due to mutual induction between two coils. As a result, the impedance is adjustable over a wide range.

As described above in relation to the first example configuration (see FIG. 22C), the direction along the first coupling portion 11e from the common terminal 3 toward the at least one filter 7 may coincide with the direction along the second coupling portion 13e from the signal line 9 toward the reference potential part 15.

In this case, the impedance of the filter device 1 may be raised closer to the target value due to the inductive coupling.

As described above in relation to the second example configuration (see FIG. 3C) in the present embodiment, the direction along the first coupling portion 11e from the common terminal 3 toward the at least one filter 7 may be opposite to the direction along the second coupling portion 13e from the signal line 9 toward the reference potential part 15.

In this case, the impedance of the filter device 1 may be lowered closer to the target due to the inductive coupling.

As illustrated in FIG. 1, the at least one second inductor 13 in the present embodiment may be connected to the signal line 9 at a point closer than the first inductor 11 to the at least one filter 7.

In this case, it is easily ensured that the second line 13a has an adequate length when a specific configuration of the filter device 1 is adopted. More specifically, the example structure illustrated in FIG. 12 offers the following advantage. The terminal (not illustrated) placed at the reference potential is located on the main surface 53b of the substrate 53. As the distance between the connection point 9b (see FIG. 1) and the at least one filter 7 (the main surface 53a) decreases, the distance between the connection point 9b and the reference potential terminal increases. That is, the second line 13a can be made longer easily. This configuration reduces the possibility that a signal intended to be transmitted between the common terminal 3 and the signal terminal 5 will be transmitted to the reference potential terminal through the second line 13a.

As illustrated in FIG. 8A, the at least one second inductor 13 in the present embodiment may be connected to the signal line 9 at a point closer than the first inductor 11 to common terminal 3.

In this case, simplification may be achieved through the adoption of a specific configuration of the filter device 1. Suppose the positions of the first inductor 11 and the at least one second inductor 13 in the example structure illustrated in FIG. 13 are exchanged, in which case the second inductor 13 is connected to the signal line 9 at a point closer than the first inductor 11 to the filter 7 (the main surface 25a). For example, a through-conductor extending through the frame part 65a and a through-conductor extending through the lid part 65b may shifted apart from each other along a plane extending along the D1 and D2 axes. In this case, the first line 11a is disposed so as to form a connection between these conductors. The need for such a modification is reduced in the case in which the at least one second inductor 13 is closer than the first inductor 11 to the common terminal 3.

As illustrated in FIG. 9, the filter device 401 in the present embodiment may include two second inductors 13. One of the second inductors 13 is connected to the signal line 9 at a point closer than the first inductor 11 to the common terminal 3. The other second inductor 13 is connected to the signal line 9 at a point closer than the first inductor 11 to the at least one filter 7.

This configuration helps enhance the coupling between the first inductor 11 and the reference potential part 15. As a result, the impedance is adjustable over a wide range, and greater design flexibility is provided accordingly.

As illustrated in FIG. 12, the filter device 1 in the present embodiment may also include the chip 51 and the substrate 53. The at least one filter 7 is at least partially disposed on the chip 51. The chip 51 is mounted on the substrate 53. The first inductor 11 and/or the at least one second inductor 13 may be a conductor included in the substrate 53.

The procedure of providing the first inductor 11 and the at least one second inductor 13 in the form of conductors is easier than mounting the first inductor 11 and the at least one second inductor 13 on the chip 51. Suppose the inductors are mounted on the chip 51 in the example illustrated in FIG. 12. In this case, the inductors are mounted on, for example, the main surface 25a of the substrate 25. The resultant enlargement of the main surface 25a leads to an increase in the size of the filter device 1. Unlike the substrate 25, the substrate 53 may be a multilayer substrate. The area of the substrate 53 is typically larger than the area of the chip 51. These features ensure the ease of forming the conductors and the ease of providing the first inductor 11 and the at least one second inductor 13 in the form of conductor layers arranged in a stack.

As illustrated in FIG. 13, the filter device 1 in the present embodiment may also include the chip 51 and the cover 65. The chip 51 may have the first surface (the main surface 25a) on which the at least one filter 7 is at least partially disposed. The main surface 25a may be covered with the cover 65. The first inductor 11 and/or the at least one second inductor 13 may be a conductor located within the cover 65 and/or on a surface of the cover 65.

The procedure of providing the first inductor 11 and the at least one second inductor 13 in the form of conductors is easier than mounting the first inductor 11 and the second inductor 13 on the chip 51. As mentioned above, mounting the inductors on the chip 51 necessitates an enlargement of the main surface 25a of the substrate 25, thus leading to an increase in the size of the filter device 1. Using the cover 65 as a mounting place for the conductors minimizes the increase in the size of the chip 51. The cover 65 is stacked on the main surface 25a and typically includes insulating layers stacked on top of each other. These features ensure the ease of providing the first inductor 11 and the at least one second inductor 13 in the form of conductor layers arranged in a stack.

As illustrated in FIG. 14, the filter device 1 in the present embodiment may also include the chip 51 and the substrate 53. At least one filter 7 is at least partially disposed on the chip 51. The chip 51 is mounted on the substrate 53. The first inductor 11 and the at least one second inductor 13 each may be a chip inductor mounted on the substrate 53.

This configuration obviates the need of building the inductors in the chip 51 and the substrate 53, thus providing ease in designing the chip 51 and the substrate 53. In the prototype stage, the distance between the chip inductors may be varied for measurement of impedance and for analysis of the effect of inductive coupling. Thus, design changes may be easily made on the basis of prototypes.

The filter device 1 according to the present embodiment may be a multiplexer. That is, the filter device 1 may include a plurality of filters 7. The plurality of filters 7 may be connected to the common terminal 3 in a manner so as to branch off downstream of the common terminal 3. The plurality of filters 7 may have different passbands. The first inductor 11 may be closer than all of the plurality of filters 7 to the common terminal 3. The at least one second inductor 13 may be connected to a point closer than all of the plurality of filters 7 to the common terminal 3.

In this case, the multiplexer is placed under the impedance-matched condition and, by extension, achieves a decrease in VSWR and a decrease in insertion loss in multiple frequency bands.

The common terminal 3 in the present embodiment is an example of the port. Each of the signal terminals 5 in the second modification illustrated in FIG. 8B is another example of the port. The main surface 25a in the second example structure illustrated in FIG. 13 is an example of the first surface. The RF-IC 153 is an example of an integrated circuit element.

The technique disclosed herein is not limited to the embodiment described above and the modification thereof and may be implemented in various forms. For example, the filter device disclosed herein can reduce the necessity for an impedance matching LC circuit; nevertheless, the filter may include such an LC circuit.

REFERENCE SIGNS LIST 1 filter device
3 common terminal (port)
7 filter
9 signal line
11 first inductor
13 second inductor
15 reference potential part

The invention claimed is:
1. A filter device, comprising:
a port through which a signal is input and/or through which the signal is output;
a reference potential part placed at a reference potential;
at least one filter that filters the signal;
a signal line that connects the port to the at least one filter;
a first inductor that is at least part of the signal line, wherein the first inductor includes a first line; and
at least one second inductor that forms a connection between the signal line and the reference potential part, wherein the at least one second inductor includes a second line;
wherein:
the first inductor and the at least one second inductor are inductively coupled to each other,
the first line and the second line include a first coupling portion and a second coupling portion, respectively, the first and second coupling portions extending in parallel to provide inductive coupling between the first line and the second line, and
a direction along the first coupling portion from the port toward the at least one filter is opposite to the direction along the second coupling portion from the signal line toward the reference potential part.
2. A communication apparatus, comprising:
the filter device according to claim 1;
an antenna connected to the port; and
an integrated circuit element connected in such a manner that the integrated circuit element and the port are located on opposite sides with the at least one filter therebetween.

3. The filter device according to claim 1, further comprising a first conductor layer and a second conductor layer that are arranged in a stack, wherein
the first line is included in the first conductor layer,
the second line is included in the second conductor layer, and
the first coupling portion and the second coupling portion overlap each other when viewed in plan through the first conductor layer and the second conductor layer.

4. The filter device according to claim 3, wherein
the second line includes a winding section when viewed in a plan view, and
at least part of the winding section is the second coupling portion.

5. The filter device according to claim 4, wherein
the first line includes the winding section when viewed in the plan view, and
at least part of the winding section is the first coupling portion.

6. The filter device according to claim 1, wherein the first coupling portion and the second coupling portion extend in parallel and wind along with each other.

7. The filter device according to claim 1, wherein
the at least one filter comprises a plurality of filters,
the plurality of filters are connected to the port in a manner so as to branch off downstream of the port,
the plurality of filters have different passbands,
the first inductor is closer than all of the plurality of filters to the port, and
the at least one second inductor is connected to a point closer than all of the plurality of filters to the port.

8. The filter device according to claim 1, further comprising:
a chip on which the at least one filter is at least partially disposed;
a substrate on which the chip is mounted; and
chip inductors mounted on the substrate, each of the first inductor and the at least one second inductor being a corresponding one of the chip inductors.

9. The filter device according to claim 1, wherein the at least one second inductor is connected to the signal line at a point closer than the first inductor to the at least one filter.

10. The filter device according to claim 1, wherein the at least one second inductor is connected to the signal line at a point closer than the first inductor to the port.

11. The filter device according to claim 1, wherein
the at least one second inductor comprises two second inductors,
one of the two second inductors is connected to the signal line at a point closer than the first inductor to the at least one filter, and
the other second inductor is connected to the signal line at a point closer than the first inductor to the port.

12. The filter device according to claim 1, further comprising:
a chip on which the at least one filter is at least partially disposed; and
a substrate on which the chip is mounted, wherein
the first inductor and/or the at least one second inductor is a conductor included in the substrate.

13. The filter device according to claim 1, further comprising:
a chip having a first surface on which the at least one filter is at least partially disposed; and
a cover that covers the first surface, wherein
the first inductor and/or the at least one second inductor is a conductor located within the cover and/or on a surface of the cover.

14. A filter device, comprising:
a port through which a signal is input and/or through which the signal is output;
a reference potential part placed at a reference potential;
at least one filter that filters the signal;
a signal line that connects the port to the at least one filter;
a first inductor that is at least part of the signal line; and
at least one second inductor that forms a connection between the signal line and the reference potential part, wherein:
the first inductor and the at least one second inductor are inductively coupled to each other,
the at least one second inductor comprises two second inductors,
one of the two second inductors is connected to the signal line at a point closer than the first inductor to the at least one filter, and
the other second inductor is connected to the signal line at a point closer than the first inductor to the port.

15. The filter device according to claim 14, wherein
the first inductor includes a first line,
the at least one second inductor includes a second line, and
the first line and the second line include a first coupling portion and a second coupling portion, respectively, the first and second coupling portions extending in parallel to provide inductive coupling between the first line and the second line.

16. The filter device according to claim 14, wherein
a first direction along a first coupling portion from the port toward the at least one filter coincides with a second direction along a second coupling portion from the signal line toward the reference potential part.

17. A communication apparatus, comprising:
the filter device according to claim 14;
an antenna connected to the port; and
an integrated circuit element connected in such a manner that the integrated circuit element and
an integrated circuit element connected in such a manner that the integrated circuit element and the port are located on opposite sides with the at least one filter therebetween.

18. The filter device according to claim 14, further comprising:
a chip on which the at least one filter is at least partially disposed; and
a substrate on which the chip is mounted, wherein
the first inductor and/or the at least one second inductor is a conductor included in the substrate.

19. The filter device according to claim 14, further comprising:
a chip having a first surface on which the at least one filter is at least partially disposed; and
a cover that covers the first surface, wherein
the first inductor and/or the at least one second inductor is a conductor located within the cover and/or on a surface of the cover.

20. The filter device according to claim 14, further comprising:
a chip on which the at least one filter is at least partially disposed;
a substrate on which the chip is mounted; and chip inductors mounted on the substrate, each of the first inductor and the at least one second inductor being a corresponding one of the chip inductors.

\* \* \* \* \*